United States Patent
Chen et al.

(10) Patent No.: US 10,269,767 B2
(45) Date of Patent: Apr. 23, 2019

(54) MULTI-CHIP PACKAGES WITH MULTI-FAN-OUT SCHEME AND METHODS OF MANUFACTURING THE SAME

(71) Applicant: Taiwan Semiconductor Manufacturing Company, Ltd., Hsin-Chu (TW)

(72) Inventors: Hsien-Wei Chen, Hsin-Chu (TW); Jie Chen, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/815,055

(22) Filed: Jul. 31, 2015

(65) Prior Publication Data

US 2017/0033080 A1 Feb. 2, 2017

(51) Int. Cl.
*H01L 21/56* (2006.01)
*H01L 23/00* (2006.01)
(Continued)

(52) U.S. Cl.
CPC ........ *H01L 25/0657* (2013.01); *H01L 21/563* (2013.01); *H01L 21/565* (2013.01); *H01L 23/3114* (2013.01); *H01L 23/3675* (2013.01); *H01L 24/19* (2013.01); *H01L 25/50* (2013.01); *H01L 21/568* (2013.01); *H01L 2224/04105* (2013.01); *H01L 2224/12105* (2013.01);
(Continued)

(58) Field of Classification Search
CPC ....... H01L 2924/00; H01L 2224/32225; H01L 2924/00014; H01L 2924/181; H01L 2224/16225; H01L 2224/73204; H01L 2224/48091; H01L 23/49827; H01L 25/0657; H01L 2224/04105; H01L 2224/12105; H01L 2225/06541; H01L 2924/14
USPC ......... 257/E23.067, 686, 738, 774, E21.502, 257/E21.705, E23.021, E25.013, 777, 257/778, 787; 438/109, 122, 127, 108, 438/118, 121
See application file for complete search history.

(56) References Cited

U.S. PATENT DOCUMENTS 5,353,498 A * 10/1994 Fillion .................. H01L 21/568
257/E21.505
8,361,842 B2    1/2013 Yu et al.
(Continued)

FOREIGN PATENT DOCUMENTS

KR     20140113488 A     9/2014
TW       201130102 A1    9/2011
(Continued)

*Primary Examiner* — Nduka E Ojeh
(74) *Attorney, Agent, or Firm* — Slater Matsil, LLP

(57) ABSTRACT

A package may include a first chip having a first surface and a second surface opposite the first surface; a first redistribution line (RDL) coupled to the first surface of the first chip; a second chip having a first surface and a second surface opposite the first surface, the first surface of the second chip facing the first chip; a second RDL disposed between the first chip and the second chip and coupled to the first surface of the second chip; a conductive via laterally adjacent to the second chip, the conductive via coupled to the second RDL; and a molding compound disposed between the second chip and the conductive via.

19 Claims, 19 Drawing Sheets

(51) Int. Cl.
  H01L 23/31    (2006.01)
  H01L 25/00    (2006.01)
  H01L 23/367   (2006.01)
  H01L 25/065   (2006.01)
  H01L 23/48    (2006.01)
  H01L 23/52    (2006.01)
  H01L 29/40    (2006.01)

(52) U.S. Cl.
  CPC ......... *H01L 2224/32225* (2013.01); *H01L 2224/73267* (2013.01); *H01L 2224/92244* (2013.01); *H01L 2225/06524* (2013.01); *H01L 2225/06548* (2013.01); *H01L 2225/06589* (2013.01)

(56) References Cited

U.S. PATENT DOCUMENTS

| | | | |
|---|---|---|---|
| 8,383,457 B2 | 2/2013 | Pagaila et al. | |
| 8,519,537 B2 | 8/2013 | Jeng et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 8,901,730 B2 | 12/2014 | Liu et al. | |
| 9,082,636 B2 | 7/2015 | Lin et al. | |
| 9,087,835 B2 | 7/2015 | Sutardja et al. | |
| 2006/0220245 A1* | 10/2006 | Ho | H01L 21/563 257/738 |
| 2009/0239336 A1* | 9/2009 | Lee | H01L 21/6835 438/107 |
| 2010/0140779 A1* | 6/2010 | Lin | H01L 23/49816 257/690 |
| 2011/0291288 A1 | 12/2011 | Wu et al. | |
| 2012/0129300 A1* | 5/2012 | Lin | H01L 21/56 438/122 |
| 2013/0001797 A1* | 1/2013 | Choi | H01L 25/105 257/774 |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0273694 A1* | 10/2013 | Hsieh | H01L 23/427 438/113 |
| 2013/0307140 A1 | 11/2013 | Huang et al. | |
| 2014/0070403 A1* | 3/2014 | Pan | H01L 21/56 257/737 |
| 2014/0077364 A1 | 3/2014 | Marimuthu et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2016/0005673 A1* | 1/2016 | Standing | H01L 23/36 257/712 |
| 2016/0181211 A1 | 6/2016 | Kamgaing et al. | |
| 2016/0190107 A1 | 6/2016 | Meyer et al. | |
| 2017/0092617 A1* | 3/2017 | Wu | H01L 24/32 |
| 2017/0133351 A1* | 5/2017 | Su | H01L 25/50 |

FOREIGN PATENT DOCUMENTS

| | | |
|---|---|---|
| TW | 201214626 A | 4/2012 |
| TW | 201214658 | 4/2012 |
| TW | 201347132 A | 11/2013 |
| TW | 201411746 A | 3/2014 |
| TW | 201519379 A | 5/2015 |

\* cited by examiner

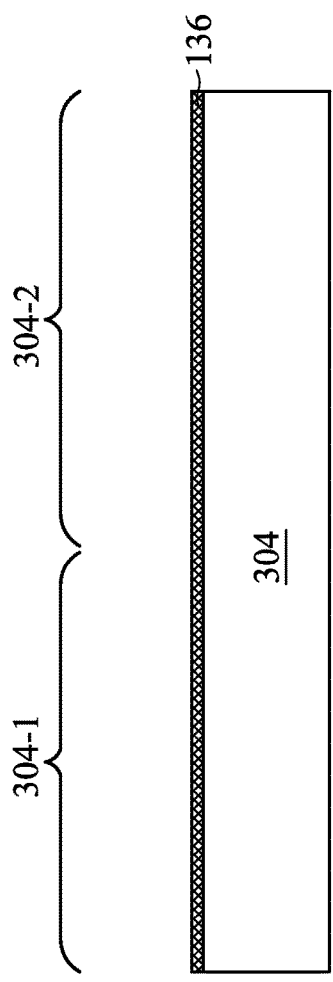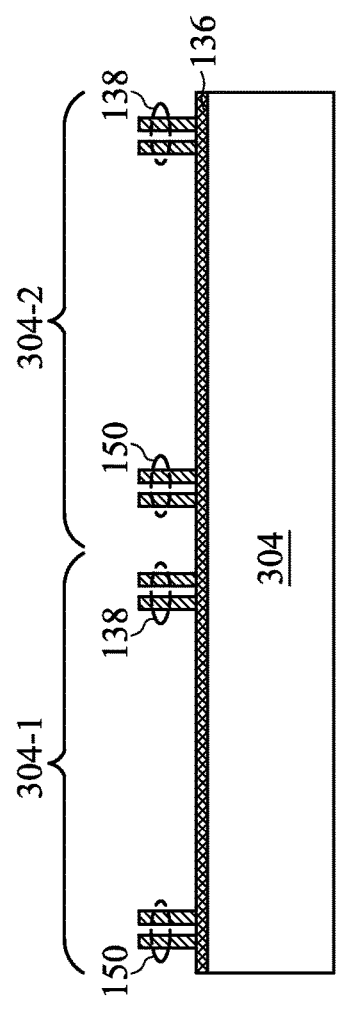

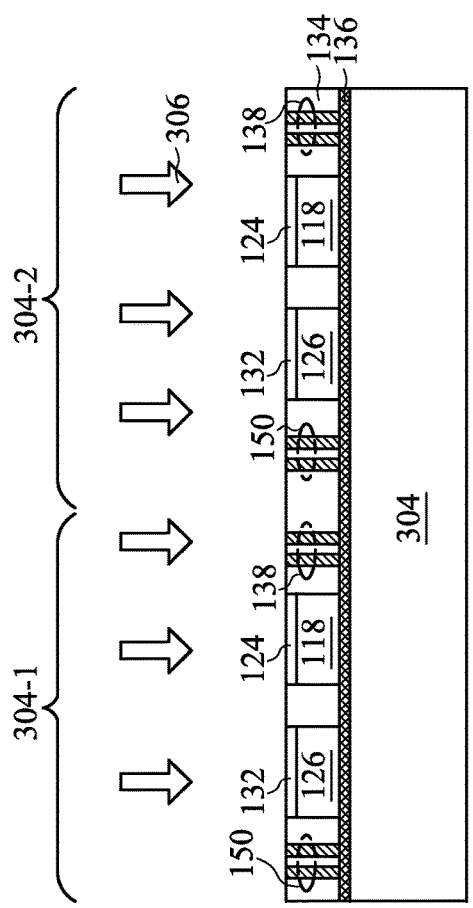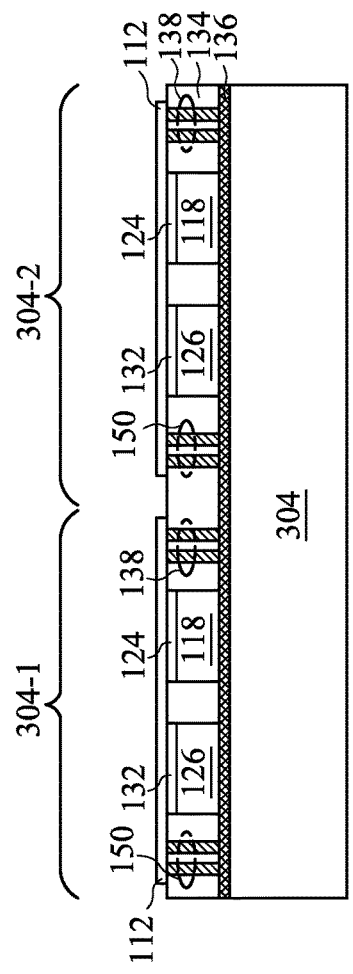
Fig. 3E
Fig. 3F

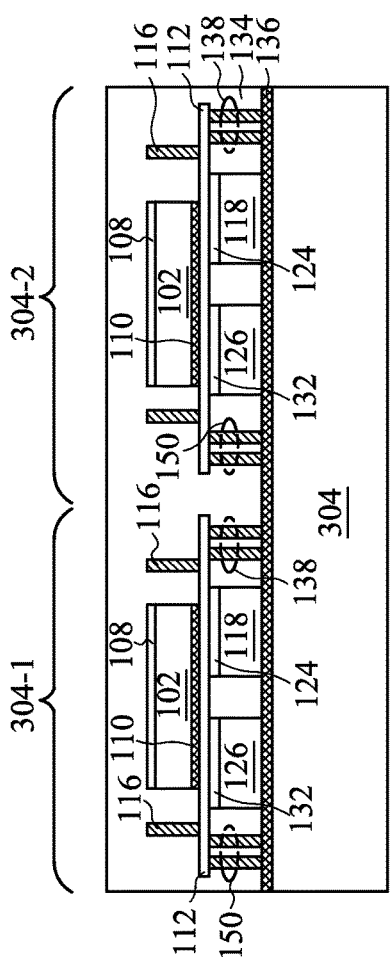
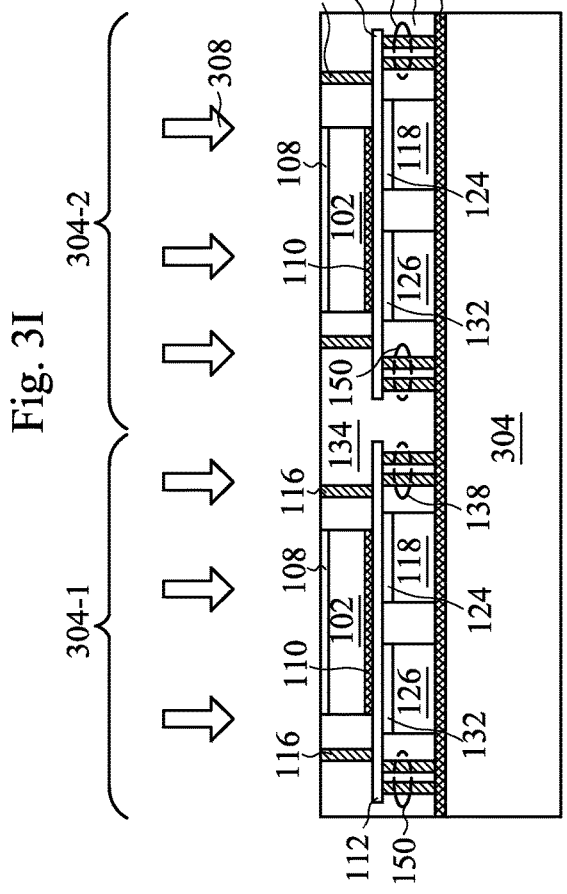

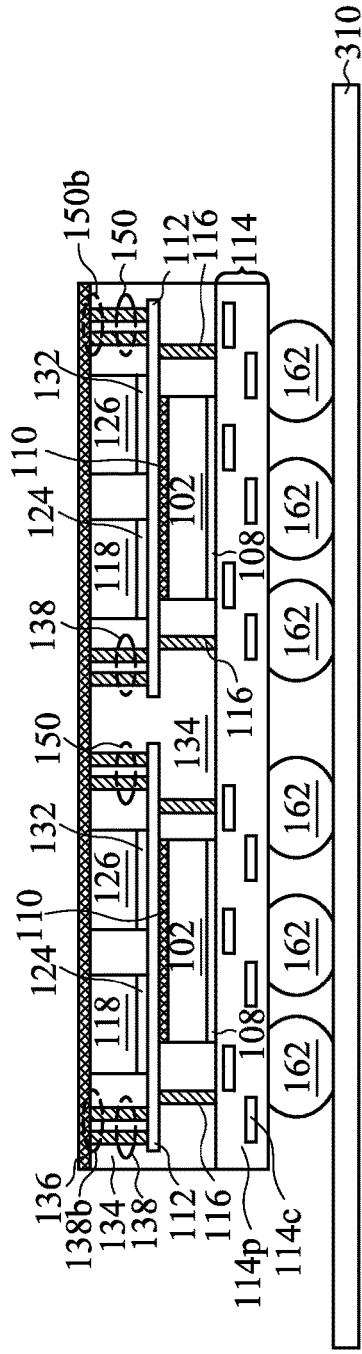
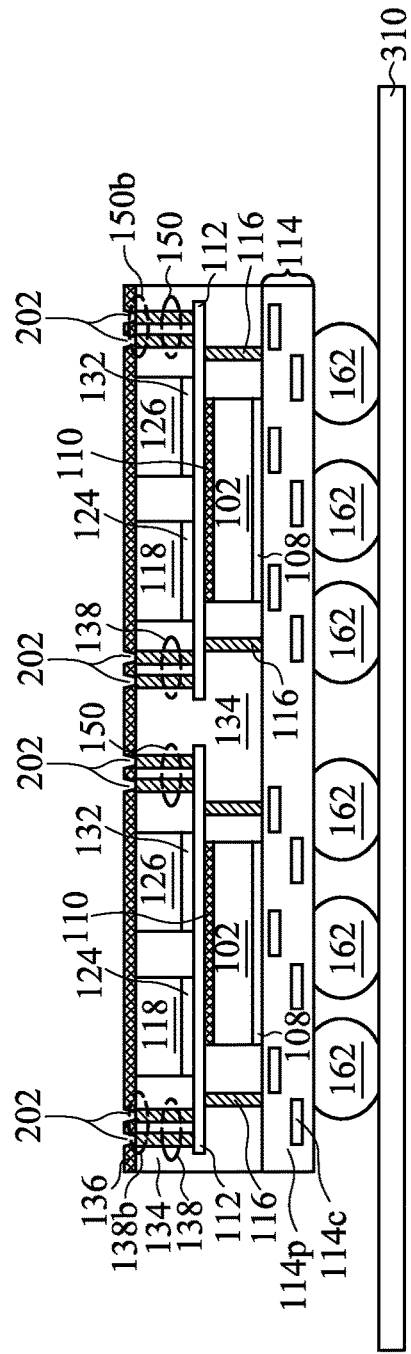
Fig. 3M
Fig. 3N

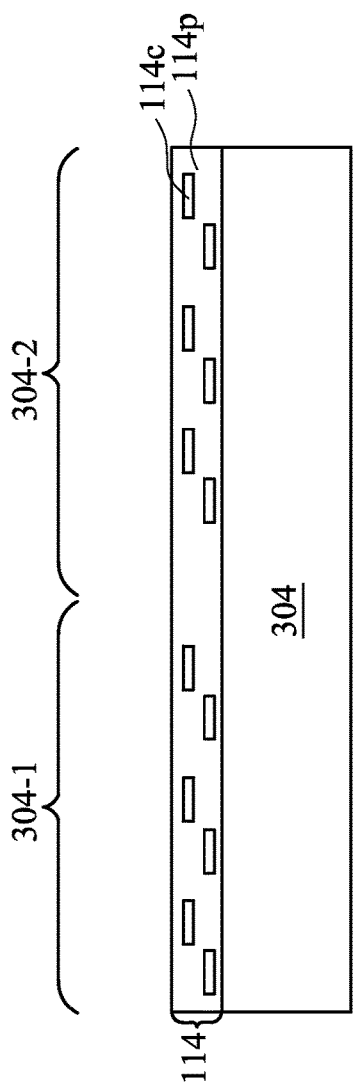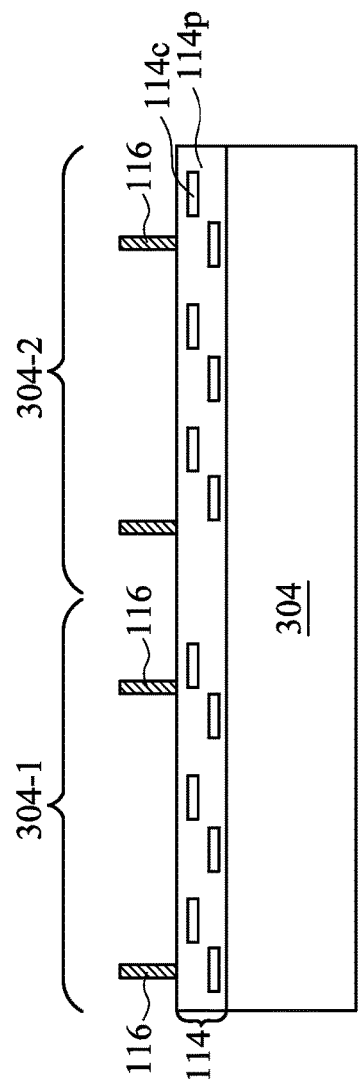
Fig. 6A
Fig. 6B

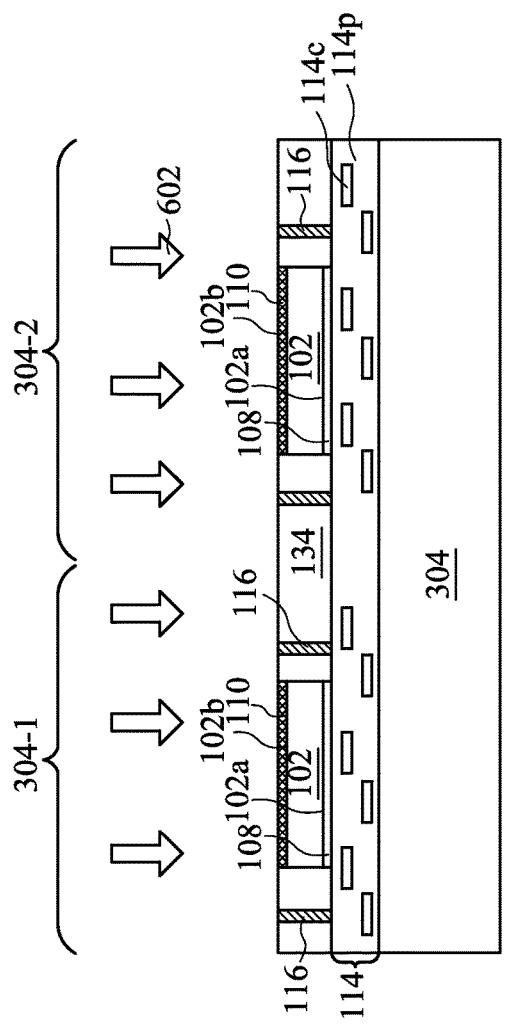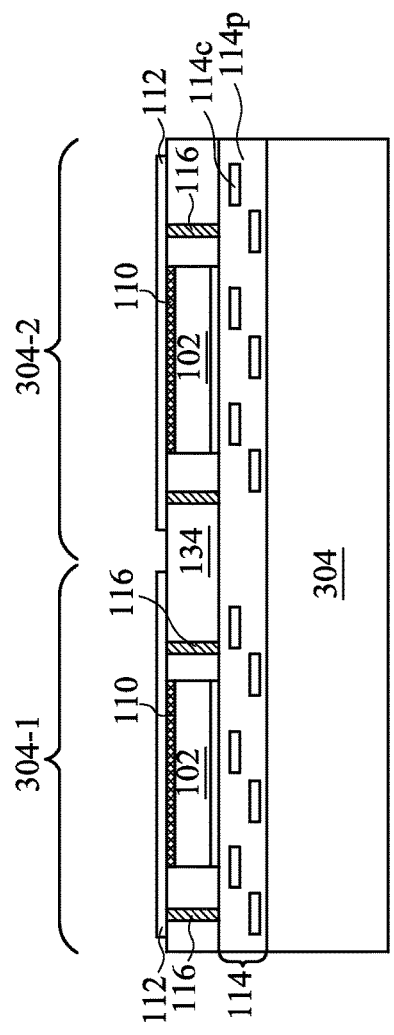

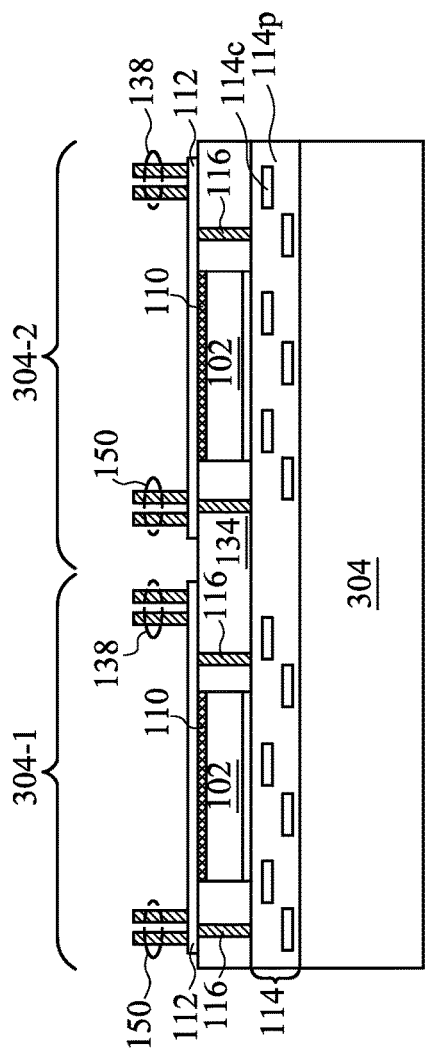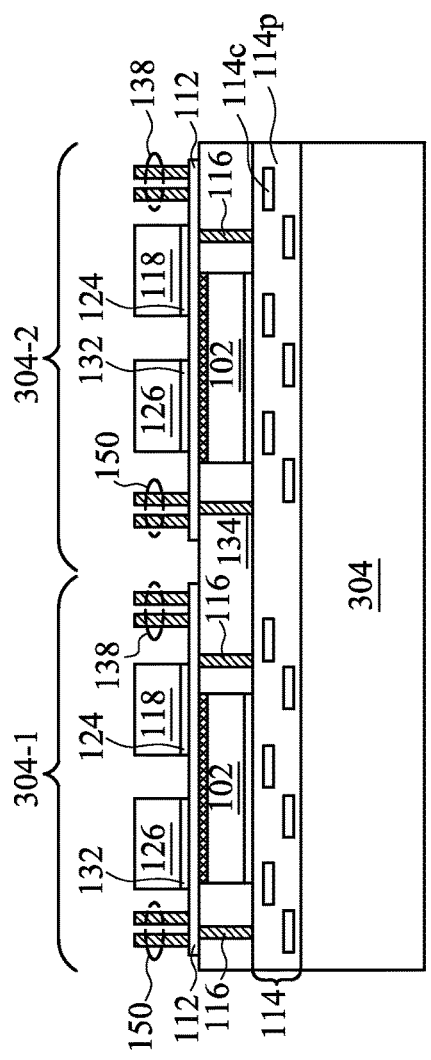

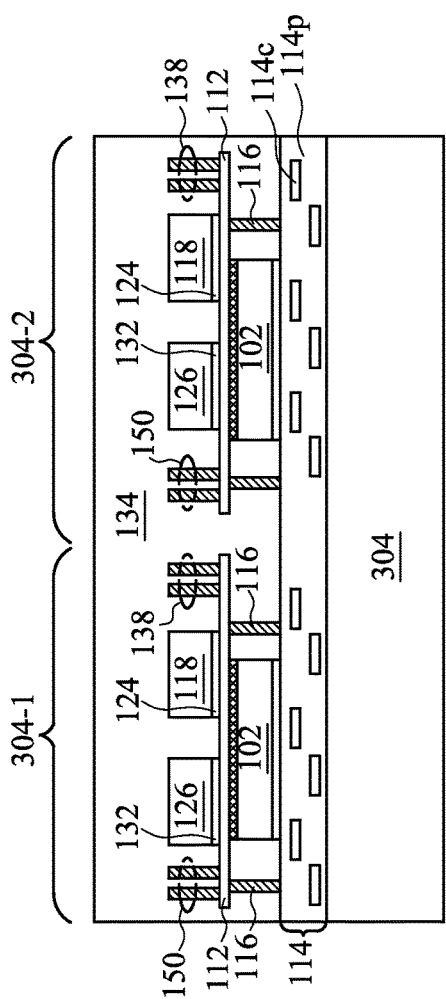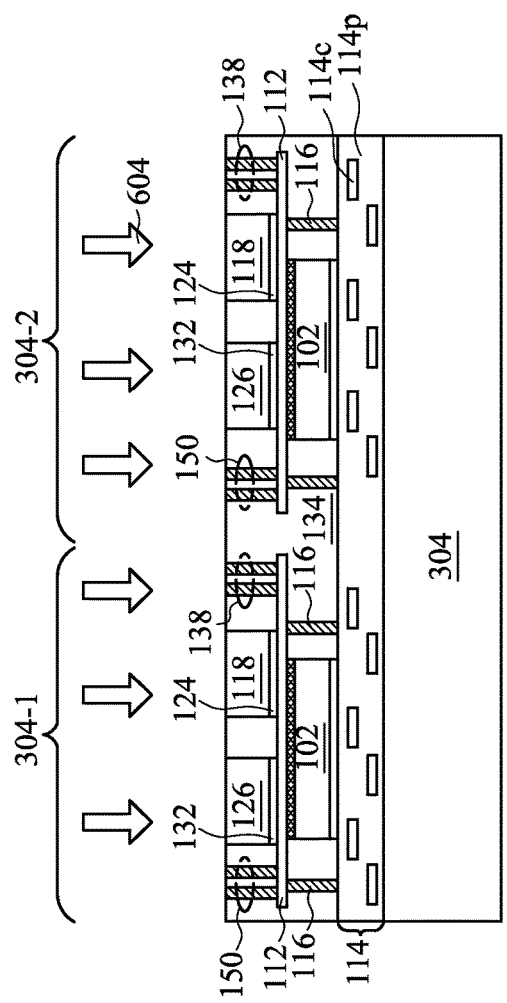

MULTI-CHIP PACKAGES WITH MULTI-FAN-OUT SCHEME AND METHODS OF MANUFACTURING THE SAME

BACKGROUND

In an aspect of packaging technologies, redistribution layers (RDL fan-outs) may be formed over a die and electrically connected to active devices in the die. Input/output (I/O) connectors such as solder balls on under-bump metallurgy (UBMs) may then be formed to electrically connect to the die through the RDLs. An advantageous feature of this packaging technology is the possibility of forming fan-out packages. Thus, the I/O pads on the die can be redistributed to cover a greater area than the die, and hence the number of I/O pads packed on the surfaces of the packaged dies can be increased.

Integrated Fan Out (InFO) package technology is becoming increasingly popular, particularly when combined with Wafer Level Packaging (WLP) technology. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
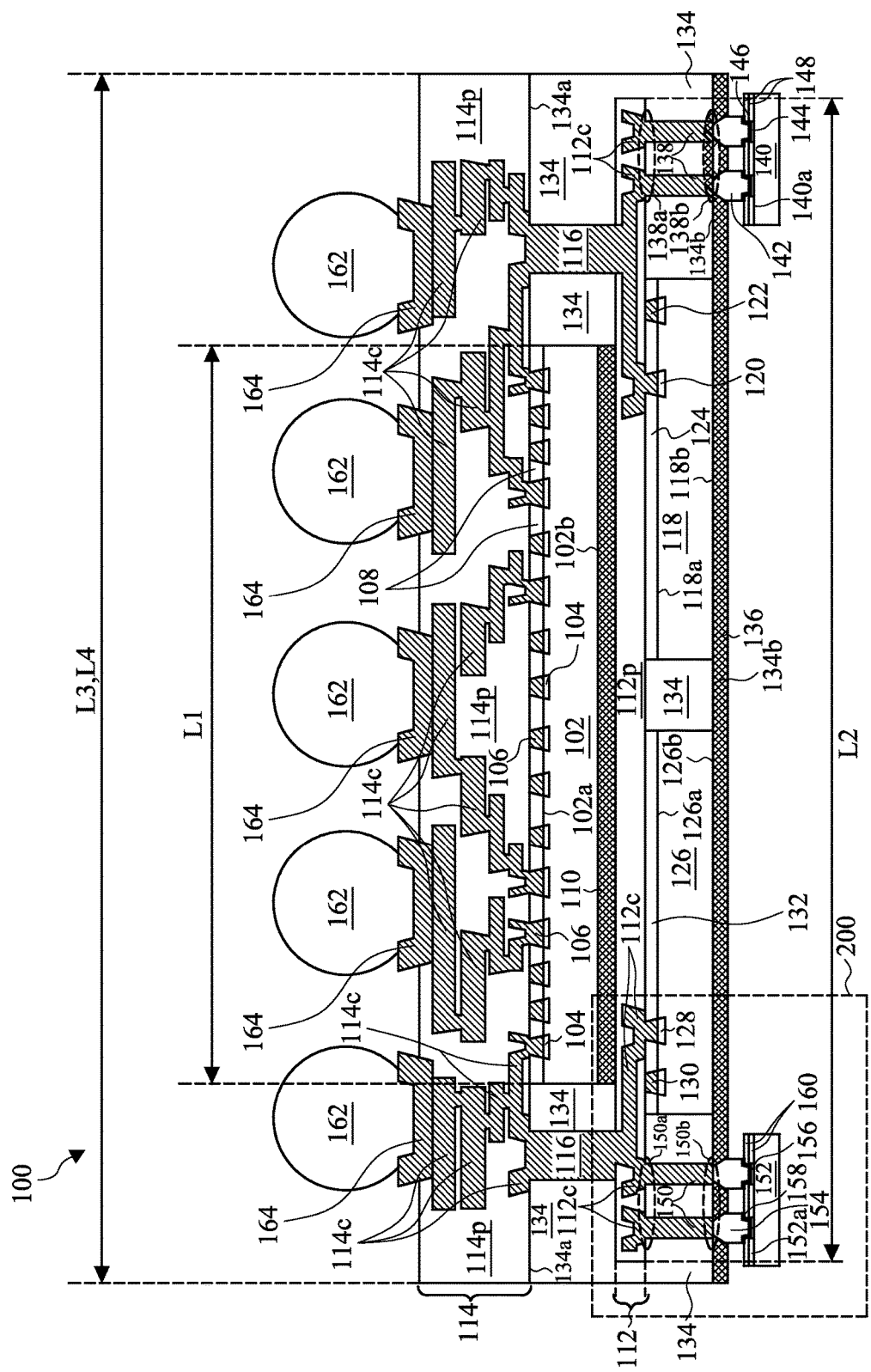
FIG. 1 shows a multi-chip package, in accordance with an embodiment.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a multi-chip package 100 comprising a plurality of chips, in accordance with one or more embodiments. The multi-chip package 100 may be a multi-chip fan-out package, as an example. The package 100 may include a first chip 102, a second chip 118, a third chip 126, a fourth chip 140, and a fifth chip 152 included in a single package. Each of the chips of the package 100 may have been subjected to one or more functional tests (e.g. electrical connection and stress tests) and may have passed such functional tests. In such an example, each of the first chip 102, the second chip 118, the third chip 126, the fourth chip 140, and the fifth chip 152 may be a known good die (KGD).

The first chip 102 may comprise a semiconductor die and could be any type of integrated circuit. As an example, the first chip 102 may comprise a processor chip, a logic chip, a memory chip, an analog circuit, a digital circuit, a mixed signal device, an imaging device, a MEMS device, combinations thereof, or the like. As a further example, the first chip 102 may be a system-on-chip (SoC) integrated circuit that includes digital, analog, mixed-signal, and/or radio-frequency functions on a single chip substrate.

The first chip 102 may include a substrate, one or more active devices, and an interconnect structure. The substrate, one or more active devices, and interconnect structure of the first chip 102 are not shown in FIG. 1 for the sake of simplicity. The substrate of the first chip 102 may be a bulk silicon substrate, although other semiconductor materials including group III, group IV, and group V elements may also be used. Alternatively, the substrate may be a silicon-on-insulator substrate, a germanium-on-insulator substrate, or the like.

The one or more active devices of the first chip 102 may be formed within and/or atop the substrate of the first chip 102 using suitable semiconductor manufacturing processes. The one or more active devices may comprise one or more transistors, as an example. The interconnect structure of the first chip 102 may be formed over the substrate and the one or more active devices of the first chip 102. The interconnect structure may electrically connect the one or more active devices of the first chip 102 to form functional circuits in the first chip 102.

The interconnect structure may include one or more inter-layer dielectric (ILD) layers and/or one or more inter-metal dielectric (IMD) layers containing conductive features formed therein. The interconnect structure of the first chip 102 may be formed by forming the one or more ILD and/or IMD layers (e.g. by a spin coating or a deposition process) over the substrate of the first chip 102, patterning the one or more ILD and/or IMD layers (e.g. using a combination of photolithography and etching processes) to form openings therein, and forming the conductive features in the openings of the one or more ILD and/or IMD layers (e.g. by depositing a seed layer in the patterns formed in the one or more ILD and/or IMD layers and overfilling the patterns with a conductive material which may be planarized subsequently). The conductive features may include, or may be, conductive lines and/or vias, which may comprise a conductive material such as copper, aluminum, tungsten, combinations thereof, or the like. The one or more ILD and/or IMD layers may include, or may consist of, low-k dielectric materials having k values, for example, less than or equal to about 4.0 (e.g. less than or equal to about 2.8) disposed between the conductive features. In some embodiments, the one or more ILD and/or IMD layers of the interconnect structure may be include, or may consist of, for example, silicon oxide, SiCOH, undoped silica glass (USG), or the like.

The first chip 102 may include input/output (I/O) features that may be formed over the interconnect structure of the first chip 102, as an example. For example, the first chip 102 may comprise a plurality of first contact pads 104 that may function as I/O features of the first chip 102. The first contact pads 104 may be formed at a first surface 102*a* (e.g. active surface) of the first chip 102. The first contact pads 104 may include, or may consist of, a conductive material such as aluminum, copper, or the like. The first contact pads 104 may be formed by any suitable process, such as a deposition and etching, damascene or dual damascene, or other suitable processes with any suitable conductive material. In the example shown in FIG. 1, surfaces of the first contact pads 104 facing away from the first chip 102 are substantially coplanar with the first surface 102*a* of the first chip 102. However, in another example, the first contact pads 104 may be formed atop the first surface 102*a* of the first chip 102. The first contact pads 104 may be electrically connected to the one or more active devices of the first chip 102 through the various conductive features in the interconnect structure of the first chip 102.

The package 100 may also include a plurality of first conductive pillars 106 disposed over and electrically connected to the first contact pads 104. For example, a respective conductive pillar of the plurality of first conductive pillars 106 may be disposed over a respective contact pad of the plurality of first contact pads 104. The first conductive pillars 106 may include, or may consist of, copper, tungsten, combinations thereof, or the like.

The package 100 may include a first insulating layer 108 disposed over first surface 102*a* of the first chip 102. The first insulating layer 108 may additionally surround the first conductive pillars 106. A surface of the first insulating layer 108 facing away from the first surface 102*a* of the first chip 102 may be substantially coplanar with surfaces of the first conductive pillars 106 facing away from the first surface 102*a* of the first chip 102, as shown in FIG. 1. The first insulating layer 108 may include, or may consist of, an insulating material, such as polyimide (PI), polybenzoxazole (PBO), benzocyclobuten (BCB), epoxy, silicone, acrylates, nano-filled pheno resin, siloxane, a fluorinated polymer, polynorbornene, or the like.

In an embodiment, the first insulating layer 108 may be formed by coating or depositing a suitable insulating material (e.g. PI, PBO, etc.) over the first surface 102*a* of the first chip 102, and patterning the insulating material to form openings therein (e.g. using a combination of photolithography and etching processes). The first conductive pillars 106 may thereafter be formed in the openings of the patterned first insulating layer 108 by filling the openings of the patterned first insulating layer 108 with conductive material. The filling of the openings of the patterned first insulating layer 108 may include depositing a seed layer in the openings and plating the openings (e.g. electro-chemically plating, electroless plating, and the like) with a conductive material. The conductive material may overfill the openings of the patterned first insulating layer 108, and a planarizing process (e.g. an etching process or a chemical-mechanical polishing (CMP) process) may be performed to remove excess portions of the conductive material over the first insulating layer 108 to form the first conductive pillars 106.

In another embodiment, the first conductive pillars 106 may already be formed over the first contact pads 104 (e.g. by electro-chemically plating, electroless plating, or the like). The first insulating layer 108 may thereafter be formed over the first surface 102*a* of the first chip 102 and over the first conductive pillars 106 (e.g. by a coating or deposition process). Such a step may cover the first surface 102*a* of the first chip 102 and the surfaces of the first conductive pillars 106 facing away from the first surface 102*a* of the first chip 102. The first insulating layer 108 may subsequently be planarized (e.g. using a CMP process or an etching process) to expose the surface of the first conductive pillars 106 facing away from the first surface 102*a* of the first chip 102.

The first chip 102 may have a second surface 102*b* opposite the first surface 102*a*. As an example, the second surface 102*b* of the first chip 102 may be a back side of the first chip 102. The second surface 102*b* of the first chip 102 may be attached to a first adhesive layer 110, which may include a glue, a polymer material, a die attach film (DAF), and the like. The package 100 may include a backside redistribution layer (RDL) 112 formed at the side of the first adhesive layer 110 facing away from the first chip 102. As an example, the first adhesive layer 110 may be disposed between the second surface 102*b* of the first chip 102 and the backside RDL 112. The first adhesive layer 110 may attach the first chip 102 to the backside RDL 112. As shown in FIG. 1, a lateral dimension L1 (e.g. a width) of the first chip 102 may be less than a lateral dimension L2 (e.g. a width) of the backside RDL 112. Furthermore, first chip 102 may be disposed within the lateral dimension L2 of the backside RDL 112.

The backside RDL 112 may include conductive features 112*c* (e.g. conductive lines and/or vias) formed in one or more first dielectric layers 112*p*. The one or more first dielectric layers 112*p* of the backside RDL 112 may be formed of any suitable insulating and/or polymer material (e.g. PI, PBO, BCB, epoxy, silicone, acrylates, nano-filled pheno resin, siloxane, a fluorinated polymer, polynorbornene, or the like) using any suitable method, such as, spin-on coating, sputtering, or the like. The formation of the conductive features 112*c* in the one or more first dielectric layers 112*p* may include patterning the one or more dielectric layers 112*p* (e.g. using a combination of photolithography and etching processes) and forming the conductive features 112*c* in the patterned one or more first dielectric layers 112*p* (e.g. by a damascene and/or dual damascene process). The conductive features 112*c* may be designed to form functional circuits and/or input/output features for other electrical components (e.g. other chips) that may be electrically connected to the first chip 102 (e.g. described below in respect of the second chip 118, the third chip 126, the fourth chip 140, and the fifth chip 152).

The package 100 may include a frontside RDL 114, which may be, but is not limited to being, substantially similar to the backside RDL 112 both in composition and formation process. For example, the frontside RDL 114 may include conductive features 114*c* (e.g. conductive lines and vias) formed in one or more second dielectric layers 114*p*. The conductive features 114*c* may be electrically connected to the first chip 102 through the first conductive pillars 106. As shown in FIG. 1, a respective conductive feature 114*c* of the frontside RDL 114 may be in contact (e.g. physical and/or electrical contact) with a respective first conductive pillar 106. Additionally, the respective conductive feature 114c may extend laterally away from the respective first conductive pillar 106. Accordingly, electrical connections from the first conductive pillars 106 may be fanned-out by means of the frontside RDL 114. Consequently, the frontside RDL 114 may also be referred to as a frontside fan-out structure. As shown in FIG. 1, the frontside RDL 114 may have a lateral dimension L3, which may be greater than the lateral dimension L1 of the first chip 102 and the lateral dimension L2 of the backside RDL 112.

The frontside RDL 114 and the backside RDL 112 may be electrically connected to each other by one or more first conductive vias 116 disposed laterally adjacent to the first chip 102. The one or more first conductive vias 116 may be disposed within the lateral dimension L2 of the backside RDL 112, as shown in FIG. 1. Only two first conductive vias 116 are shown in FIG. 1 as an example (e.g. a conductive via 116 to the left of the first chip 102 and another conductive via 116 to right of the first chip 102). However, in another example, the number of first conductive vias 116 may be less than two (e.g. one) or may be more than two (e.g. three, four, five, six, or even more) first conductive vias 116. The one or more first conductive vias 116 may include similar materials as the first contact pads 104. In the example shown in FIG. 1, the one or more first conductive vias 116 may extend into at least a portion of the backside RDL 112 and/or the frontside RDL 114, thereby contacting (e.g. physically and/or electrically contacting) the conductive features 112c and 114c of the backside RDL 112 and the frontside RDL 114.

The package 100 may include the second chip 118, which may be disposed at a side of the backside RDL 112 facing away from the first chip 102. The second chip 118 may comprise a semiconductor die and could be any type of integrated circuit. As an example, the second chip 118 may comprise a processor chip, a logic chip, a memory chip (e.g. a dynamic random access memory chip), an analog circuit, a digital circuit, a mixed signal device, an imaging device, a MEMS device, combinations thereof, or the like.

Similar to the first chip 102, the second chip 118 may include a substrate, one or more active devices, and an interconnect structure. The substrate, one or more active devices, and interconnect structure of the second chip 118 are not shown in FIG. 1 for the sake of simplicity. The substrate of the second chip 118 may comprise similar materials as the substrate of the first chip 102. The one or more active devices of the second chip 118 may be formed within and/or atop the substrate of the second chip 118 using suitable semiconductor manufacturing processes. The one or more active devices may comprise one or more transistors, as an example. The interconnect structure of the second chip 118 may be formed over the substrate and the one or more active devices of the second chip 118. The interconnect structure may electrically connect the one or more active devices of the second chip 118 to form functional circuits. The interconnect structure may include one or more interlayer dielectric (ILD) layers and/or one or more inter-metal dielectric (IMD) layers containing conductive features formed therein. The one or more ILD and/or IMD layers of the second chip 118 may comprise similar materials and may be formed using similar processes as the one or more ILD and/or IMD layers of the first chip 102. Furthermore, the conductive features in the one or more ILD and/or IMD layers of the second chip 118 may comprise similar materials and may be formed using similar processes as the conductive features in the one or more ILD and/or IMD layers of the first chip 102.

The second chip 118 may include input/output (I/O) features that may be formed over the interconnect structure of the second chip 118, as an example. For example, the second chip 118 may comprise a plurality of second contact pads 120 that may function as I/O features of the second chip 118. The second contact pads 120 may be formed at a first surface 118a (e.g. active surface) of the second chip 118. The second contact pads 120 may comprise similar materials as the first contact pads 104. The second contact pads 120 may be formed using similar processes as the first contact pads 104.

In the example shown in FIG. 1, surfaces of the second contact pads 120 facing away from the second chip 118 are substantially coplanar with the first surface 118a of the second chip 118. However, in another example, the second contact pads 120 may be formed atop the first surface 118a of the second chip 118. The second contact pads 120 may be electrically connected to the one or more active devices of the second chip 118 through the various conductive features in the interconnect structure of the second chip 118.

The package 100 may also include a plurality of second conductive pillars 122 disposed over and electrically connected to the second contact pads 120. For example, a respective conductive pillar of the plurality of second conductive pillars 122 may be disposed over a respective contact pad of the plurality of second contact pads 120. The second conductive pillars 122 may comprise similar materials as the first conductive pillars 106.

The package 100 may include a second insulating layer 124 disposed over first surface 118a of the second chip 118. The second insulating layer 124 may be disposed between the first surface 118a of the second chip 118 and the backside RDL 112. The second insulating layer 124 may additionally surround the second conductive pillars 122. A surface of the second insulating layer 124 facing away from the first surface 118a of the second chip 118 may be substantially coplanar with surfaces of the second conductive pillars 122 facing away from the first surface 118a of the second chip 118, as shown in FIG. 1. The second insulating layer 124 may comprise similar materials as the first insulating layer 108.

In an embodiment, the second insulating layer 124 may be formed by coating or depositing a suitable insulating material (e.g. PI, PBO, etc.) over the first surface 118a of the second chip 118, and patterning the insulating material to form openings therein (e.g. using a combination of photolithography and etching processes). The second conductive pillars 122 may thereafter be formed in the openings of the patterned second insulating layer 124 by filling the openings of the patterned second insulating layer 124 with conductive material. The filling of the openings of the patterned second insulating layer 124 may include depositing a seed layer in the openings and plating the openings (e.g. electro-chemically plating, electroless plating, and the like) with a conductive material. The conductive material may overfill the openings of the patterned second insulating layer 124, and a planarizing process (e.g. an etching process or a chemical-mechanical polishing (CMP) process) may be performed to remove excess portions of the conductive material over the second insulating layer 124 to form the second conductive pillars 122.

In another embodiment, the second conductive pillars 122 may already be formed over the second contact pads 120 (e.g. by electro-chemically plating, electroless plating, or the like). The second insulating layer 124 may thereafter be formed over the first surface 118a of the second chip 118 and over the second conductive pillars 122 (e.g. by a coating or deposition process). Such a step may cover the first surface 118a of the second chip 118 and the surfaces of the second conductive pillars 122 facing away from the first surface 118a of the second chip 118. The second insulating layer 124 may subsequently be planarized (e.g. using a CMP process or an etching process) to expose the surface of the second conductive pillars 122 facing away from the first surface 118a of the second chip 118.

As shown in FIG. 1, a respective conductive feature 112c of the backside RDL 112 may be in contact (e.g. physical and/or electrical contact) with a respective second conductive pillar 122. Additionally, the respective conductive feature 112c may extend laterally away from the respective second conductive pillar 122, e.g. towards one or more of the first conductive vias 116. Additionally, the respective conductive feature 112c may be coupled (e.g. physically and/or electrically coupled) to the one or more first conductive vias 116, thereby electrically connecting the second chip 118 to the one or more first conductive vias 116. Accordingly, electrical connections from the second conductive pillars 122 may be fanned-out by means of the backside RDL 112. Consequently, the backside RDL 112 may also be referred to as a backside fan-out structure. Additionally, the second chip 118 may be electrically connected to the first chip 102 through the second conductive pillars 122, the backside RDL 112, the one or more first conductive vias 116, the frontside RDL 114, and the first conductive pillars 106.

The package 100 may include the third chip 126, which may be disposed at a side of the backside RDL 112 facing away from the first chip 102. The third chip 126 may be laterally separated from the second chip 118, as shown in the example of FIG. 1. The third chip 126 may comprise a semiconductor die and could be any type of integrated circuit. As an example, the third chip 126 may comprise a processor chip, a logic chip, a memory chip (e.g. a dynamic random access memory chip), an analog circuit, a digital circuit, a mixed signal device, an imaging device, a MEMS device, combinations thereof, or the like.

Similar to the first chip 102 and the second chip 118, the third chip 126 may include a substrate, one or more active devices, and an interconnect structure. The substrate, one or more active devices, and interconnect structure of the third chip 126 are not shown in FIG. 1 for the sake of simplicity. The substrate of the third chip 126 may comprise similar materials as the substrate of the first chip 102. The one or more active devices of the third chip 126 may be formed within and/or atop the substrate of the third chip 126 using suitable semiconductor manufacturing processes. The one or more active devices may comprise one or more transistors, as an example. The interconnect structure of the third chip 126 may be formed over the substrate and the one or more active devices of the third chip 126. The interconnect structure may electrically connect the one or more active devices of the third chip 126 to form functional circuits. The interconnect structure may include one or more inter-layer dielectric (ILD) layers and/or one or more inter-metal dielectric (IMD) layers containing conductive features formed therein. The one or more ILD and/or IMD layers of the third chip 126 may comprise similar materials and may be formed using similar processes as the one or more ILD and/or IMD layers of the first chip 102. Furthermore, the conductive features in the one or more ILD and/or IMD layers of the third chip 126 may comprise similar materials and may be formed using similar processes as the conductive features in the one or more ILD and/or IMD layers of the first chip 102.

The third chip 126 may include input/output (I/O) features that may be formed over the interconnect structure of the third chip 126, as an example. For example, the third chip 126 may comprise a plurality of third contact pads 128 that may function as I/O features of the third chip 126. The third contact pads 128 may be formed at a first surface 126a (e.g. active surface) of the third chip 126. The third contact pads 128 may comprise similar materials as the first contact pads 104. The third contact pads 128 may be formed using similar processes as the first contact pads 104.

In the example shown in FIG. 1, surfaces of the third contact pads 128 facing away from the third chip 126 are substantially coplanar with the first surface 126a of the third chip 126. However, in another example, the third contact pads 128 may be formed atop the first surface 126a of the third chip 126. The third contact pads 128 may be electrically connected to the one or more active devices of the third chip 126 through the various conductive features in the interconnect structure of the third chip 126.

The package 100 may also include a plurality of third conductive pillars 130 disposed over and electrically connected to the third contact pads 128. For example, a respective conductive pillar of the plurality of third conductive pillars 130 may be disposed over a respective contact pad of the plurality of third contact pads 128. The third conductive pillars 130 may comprise similar materials as the first conductive pillars 106.

The package 100 may include a third insulating layer 132 disposed over first surface 126a of the third chip 126. The third insulating layer 132 may be disposed between the first surface 126a of the third chip 126 and the backside RDL 112. The third insulating layer 132 may additionally surround the third conductive pillars 130. A surface of the third insulating layer 132 facing away from the first surface 126a of the third chip 126 may be substantially coplanar with surfaces of the third conductive pillars 130 facing away from the first surface 126a of the third chip 126, as shown in FIG. 1. The third insulating layer 132 may comprise similar materials as the first insulating layer 108.

In an embodiment, the third insulating layer 132 may be formed by coating or depositing a suitable insulating material (e.g. PI, PBO, etc.) over the first surface 126a of the third chip 126, and patterning the insulating material to form openings therein (e.g. using a combination of photolithography and etching processes). The third conductive pillars 130 may thereafter be formed in the openings of the patterned third insulating layer 132 by filling the openings of the patterned third insulating layer 132 with conductive material. The filling of the openings of the patterned third insulating layer 132 may include depositing a seed layer in the openings and plating the openings (e.g. electro-chemically plating, electroless plating, and the like) with a conductive material. The conductive material may overfill the openings of the patterned third insulating layer 132, and a planarizing process (e.g. an etching process or a chemical-mechanical polishing (CMP) process) may be performed to remove excess portions of the conductive material over the third insulating layer 132 to form the third conductive pillars 130.

In another embodiment, the third conductive pillars 130 may already be formed over the third contact pads 128 (e.g. by electro-chemically plating, electroless plating, or the like). The third insulating layer 132 may thereafter be formed over the first surface 126a of the third chip 126 and over the third conductive pillars 130 (e.g. by a coating or deposition process). Such a step may cover the first surface 126*a* of the third chip 126 and the surfaces of the third conductive pillars 130 facing away from the first surface 126*a* of the third chip 126. The third insulating layer 132 may subsequently be planarized (e.g. using a CMP process or an etching process) to expose the surface of the third conductive pillars 130 facing away from the first surface 126*a* of the third chip 126.

As shown in FIG. 1, a respective conductive feature 112*c* of the backside RDL 112 may be in contact (e.g. physical and/or electrical contact) with a respective third conductive pillar 130. Additionally, the respective conductive feature 112*c* may extend laterally away from the respective third conductive pillar 130, e.g. towards the one or more first conductive vias 116. Additionally, the respective conductive feature 112*c* may be coupled (e.g. physically and/or electrically coupled) to the one or more first conductive vias 116, thereby electrically connecting the third chip 126 to one or more the first conductive vias 116. Accordingly, electrical connections from the third conductive pillars 130 may be fanned-out by means of the backside RDL 112. Additionally, the third chip 126 may be electrically connected to the first chip 102 through the third conductive pillars 130, the backside RDL 112, the one or more first conductive vias 116, the frontside RDL 114, and the first conductive pillars 106.

The package 100 may include a molding compound 134 that encapsulates (e.g. fully encapsulates) the first chip 102 and the one or more first conductive vias 116. The molding compound 134 may additionally encapsulate (e.g. fully encapsulate) the backside RDL 112, the second chip 118, and the third chip 126. The molding compound 134 may additionally be disposed between (e.g. laterally between) the second chip 118 and the third chip 126. The molding compound 134 may include any suitable material such as an epoxy resin, a molding underfill, or the like. The molding compound 134 may have a first surface 134*a* over which a portion of the frontside RDL 114 may extend. Additionally, in some embodiments (as in the example of FIG. 1), the first surface 134*a* of the molding compound 134 may be substantially coplanar with a surface of the first insulating layer 108 facing away from the first chip 102. As shown in FIG. 1, the molding compound 134 may have a second surface 134*b* opposite the first surface 134*a*. In some embodiments (as in the example of FIG. 1), the second surface 134*b* of the molding compound 134 may be substantially coplanar with the second surface 118*b* of the second chip 118 and/or the second surface 126*b* of the third chip 126. As shown in the example of FIG. 1, the molding compound 134 may have a lateral dimension L4, which is substantially equal to the lateral dimension L3 of the frontside RDL 114.

The package 100 may include a second adhesive layer 136. The second surface 134*b* of the molding compound 134, the second surface 118*b* of the second chip 118, and the second surface 126*b* of the third chip 126 may be attached to the second adhesive layer 136, which may comprise similar materials as the first adhesive layer 110. The package 100 may also include one or more second conductive vias 138 laterally adjacent to the second chip 118. As an example, the one or more second conductive vias 138 may be laterally separated from the side of the second chip 118 opposite from the third chip 126. The one or more second conductive vias 138 may be disposed within the molding compound 134 and may additionally be disposed within the lateral dimension L2 of the backside RDL 112. Only two second conductive vias 138 are shown in FIG. 1 as an example; however, in another example, the number of second conductive vias 138 may be less than two (e.g. one) or may be more than two (e.g. three, four, five, six, or even more) second conductive vias 138. The one or more second conductive vias 138 may include similar materials as the first contact pads 104. In the example shown in FIG. 1, a first end 138*a* of the one or more second conductive vias 138 may extend into at least a portion of the backside RDL 112, thereby contacting (e.g. physically and/or electrically contacting) the conductive features 112*c* of the backside RDL 112.

As shown in FIG. 1, the one or more second conductive vias 138 may have a second end 138*b* opposite the first end 138*a*. The second end 138*b* of the one or more second conductive vias 138 may be substantially coplanar with the second surface 134*b* of the molding compound 134. Additionally, the second end 138*b* of the one or more second conductive vias 138 may be exposed by one or more openings (not shown in FIG. 1; see FIG. 2) extending through the second adhesive layer 136. One or more first conductive elements 142 may be disposed in the one or more openings of the second adhesive layer 136 and may contact (e.g. physically and/or electrically contact) the second end 138*b* of the one or more second conductive vias 138. The one or more first conductive elements 142 may comprise at least one of tin, lead, copper, gold, silver, zinc, bismuth, magnesium, antimony, indium or an alloy thereof. The one or more first conductive elements 142 may couple (e.g. electrically couple) the one or more second conductive vias 138 to a fourth chip 140, which may be disposed at a side of the second adhesive layer 136 facing away from the molding compound 134.

The fourth chip 140 may comprise an electronic device, such as a passive device (e.g. an integrated passive device), although other devices may be possible. As an example, the fourth chip 140 may comprise a processor chip, a logic chip, a memory chip (e.g. a dynamic random access memory chip), an analog circuit, a digital circuit, a mixed signal device, an imaging device, a MEMS device, combinations thereof, or the like. The fourth chip 140 may include a plurality of fourth contact pads 144 formed at a first surface 140*a* (e.g. active surface) of the fourth chip 140. The fourth contact pads 144 may comprise similar materials and may be formed using similar processes as the first contact pads 104. The fourth chip 140 may be coupled to the one or more first conductive elements 142 through the fourth contact pads 144 and a plurality of first under bump metallurgies (UBMs) 146 disposed between the fourth contact pads 144 and the one or more first conductive elements 142. The plurality of first UBMs 146 may comprise similar materials and may be formed using similar processes as the first contact pads 104.

As shown in FIG. 1, the fourth contact pads 144 and the plurality of first UBMs 146 may be disposed within a fourth insulating layer 148 (e.g. including an oxide layer and/or a nitride layer). As a result, the fourth chip 140 may be electrically connected to the first chip 102 through the one or more second conductive vias 138, the backside RDL 112, the one or more first conductive vias 116, the frontside RDL 114, and the first conductive pillars 106. Additionally, the fourth chip 140 may be electrically connected to the second chip 118 through the one or more second conductive vias 138, the backside RDL 112, and the second conductive pillars 122. Even further, the fourth chip 140 may be electrically connected to the third chip 126 through the one or more second conductive vias 138, the backside RDL 112, and the third conductive pillars 130. In some embodiments, an underfill (not shown in FIG. 1) may be disposed between the fourth insulating layer 148 and the second adhesive layer 136. In such an embodiment, the underfill may encapsulate the one or more first conductive elements 142.

As shown in FIG. 1, the fourth chip 140 may be free from the molding compound 134 and may be disposed at a side of the second adhesive layer 136 facing away from the molding compound 134. Consequently, an additional chip that is not encapsulated in the molding compound 134 (e.g. the fourth chip 140) may be mounted on or at a backside of the package 100 and electrically connected to the chips may be encapsulated in the molding compound 134 (e.g. the first chip 102, the second chip 118, and/or the third chip 126). Consequently, the backside of the package 100 may be used to expand a functionality of the package 100 and increase the functional density and/or integration density of the package 100.

The package 100 may also include one or more third conductive vias 150 laterally adjacent to the third chip 126. As an example, the one or more third conductive vias 150 may be laterally separated from the side of the third chip 126 opposite from the second chip 118. The one or more third conductive vias 150 may be disposed within the molding compound 134 and may additionally be disposed within the lateral dimension L2 of the backside RDL 112. Only two third conductive vias 150 are shown in FIG. 1 as an example; however, in another example, the number of third conductive vias 150 may be less than two (e.g. one) or may be more than two (e.g. three, four, five, six, or even more) third conductive vias 150. The one or more third conductive vias 150 may include similar materials as the first contact pads 104. In the example shown in FIG. 1, a first end 150a of the one or more third conductive vias 150 may extend into at least a portion of the backside RDL 112, thereby contacting (e.g. physically and/or electrically contacting) the conductive features 112c of the backside RDL 112.

As shown in FIG. 1, the one or more third conductive vias 150 may have a second end 150b opposite the first end 150a. The second end 150b of the one or more third conductive vias 150 may be substantially coplanar with the second surface 134b of the molding compound 134. Additionally, the second end 150b of the one or more third conductive vias 150 may be exposed by one or more openings (not shown in FIG. 1; see FIG. 2) extending through the second adhesive layer 136. One or more second conductive elements 154 may be disposed in the one or more openings of the second adhesive layer 136 and may contact (e.g. physically and/or electrically contact) the second end 150b of the one or more third conductive vias 150. The one or more second conductive elements 154 may comprise similar materials as the one or more first conductive elements 142. The one or more second conductive elements 154 may couple (e.g. electrically couple) the one or more third conductive vias 150 to a fifth chip 152, which may be disposed at a side of the second adhesive layer 136 facing away from the molding compound 134.

The fifth chip 152 may comprise a passive device (e.g. an integrated passive device), although other devices may be possible. As an example, the fifth chip 152 may comprise a processor chip, a logic chip, a memory chip (e.g. a dynamic random access memory chip), an analog circuit, a digital circuit, a mixed signal device, an imaging device, a MEMS device, combinations thereof, or the like. The fifth chip 152 may include a plurality of fifth contact pads 156 formed at a first surface 152a (e.g. active surface) of the fifth chip 152. The fifth contact pads 156 may comprise similar materials and may be formed using similar processes as the first contact pads 104. The fifth chip 152 may be coupled to the one or more second conductive elements 154 through the fifth contact pads 156 and a plurality of second under bump metallurgies (UBMs) 158 disposed between the fifth contact pads 156 and the one or more second conductive elements 154. The plurality of second UBMs 158 may comprise similar materials and may be formed using similar processes as the first contact pads 104.

As shown in FIG. 1, the fifth contact pads 156 and the plurality of second UBMs 158 may be disposed within a fifth insulating layer 160 (e.g. including an oxide layer and/or a nitride layer). As a result, the fifth chip 152 may be electrically connected to the first chip 102 through the one or more third conductive vias 150, the backside RDL 112, the one or more first conductive vias 116, the frontside RDL 114, and the first conductive pillars 106. Additionally, the fifth chip 152 may be electrically connected to the second chip 118 through the one or more third conductive vias 150, the backside RDL 112, and the second conductive pillars 122. Even further, the fifth chip 152 may be electrically connected to the third chip 126 through the one or more third conductive vias 150, the backside RDL 112, and the third conductive pillars 130. Furthermore, the fifth chip 152 and the fourth chip 140 may be electrically connected to each other through the one or more third conductive vias 150, the backside RDL 112, and the one or more second conductive vias 138. In some embodiments, an underfill (not shown in FIG. 1) may be disposed between the fifth insulating layer 160 and the second adhesive layer 136. In such an embodiment, the underfill may encapsulate the one or more second conductive elements 154.

As shown in FIG. 1, the fifth chip 152 may be free from the molding compound 134 and may be disposed at a side of the second adhesive layer 136 facing away from the molding compound 134. Consequently, an additional chip that is not encapsulated in the molding compound 134 (e.g. the fifth chip 152) may be mounted on or at a backside of the package 100 and electrically connected to the chips may be encapsulated in the molding compound 134 (e.g. the first chip 102, the second chip 118, and/or the third chip 126). Consequently, the backside of the package 100 may be used to expand a functionality of the package 100 and increase the functional density and/or integration density of the package 100.

The package 100 may include additional package features, such as a plurality of external connectors 162 that may be disposed over the frontside RDL 114. The external connectors 162 may be a ball grid array (BGA), controlled collapse chip connector (C4) bumps, or the like disposed on under metal metallurgies (UBMs) 164, which may be formed over the frontside RDL 114 (e.g. over the conductive features 114c of the frontside RDL 114). The external connectors 162 may be electrically connected to the first chip 102 by way of the frontside RDL 114. The external connectors 162 may be used to electrically connect the package 100 to other package components such as another device die, interposers, package substrates, printed circuit boards, a mother board, or the like.

Figure 2:
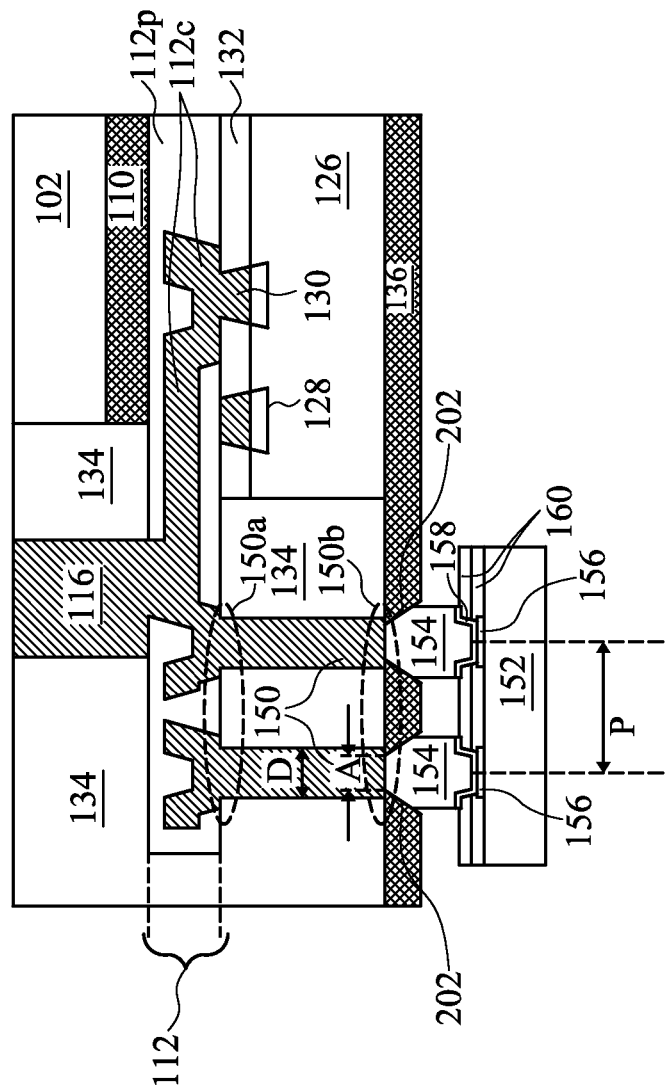
FIG. 2 shows a magnified view of a portion of the multi-chip package shown in FIG. 1, in accordance with an embodiment.

FIG. 2 shows a magnified view of a portion 200 of the package 100 shown in FIG. 1, in accordance with one or more embodiments. As shown in FIG. 2, the second adhesive layer 136 may have one or more openings 202 extending through the second adhesive layer 136. The one or more openings 202 may expose the second end 150b of the one or more third conductive vias 150. Referring to FIG. 2, each of the one or more third conductive vias 150 may have a lateral dimension D (e.g. a width or a diameter) that may be in a range from about 80 micrometers to about 120 micrometers, although other ranges may be possible as well. Additionally, the portion of the second end 150b of the one or more third conductive vias 150 exposed by the one or more openings 202 may have a lateral dimension A, which may be smaller than the lateral dimension D of the one or more third conductive vias 150. As an example, the lateral dimension A may be about 15 micrometers to about 20 micrometers smaller than the lateral dimension D of the one or more third conductive vias 150, although other ranges may be possible as well. In the embodiment where the one or more third conductive vias 150 comprises a plurality of third conductive vias 150 (e.g. as in the example of FIG. 2), a pitch P of the plurality of third conductive vias 150 may be substantially equal to a pitch of the fifth contact pads 156. As an example, the pitch P of the plurality of third conductive vias 150 may be in a range from about 200 micrometers to about 400 micrometers, although other ranges may be possible as well.

The features described above in respect of the one or more third conductive vias 150 may also be applicable to the one or more second conductive vias 138. As an example, the one or more second conductive vias 138 may have a width or a diameter substantially equal to the lateral dimension D of the one or more third conductive vias 150. Furthermore, the portion of the second end 138b of the one or more second conductive vias 138 exposed by the one or more openings in the second adhesive layer 136 may have substantially the same dimensions as the lateral dimension A. Even further, when the one or more second conductive vias 138 comprises a plurality of second conductive vias 138 (as in the example of FIG. 1), a pitch of the plurality of second conductive vias 138 may be substantially equal to the pitch P.

Figure 3C:
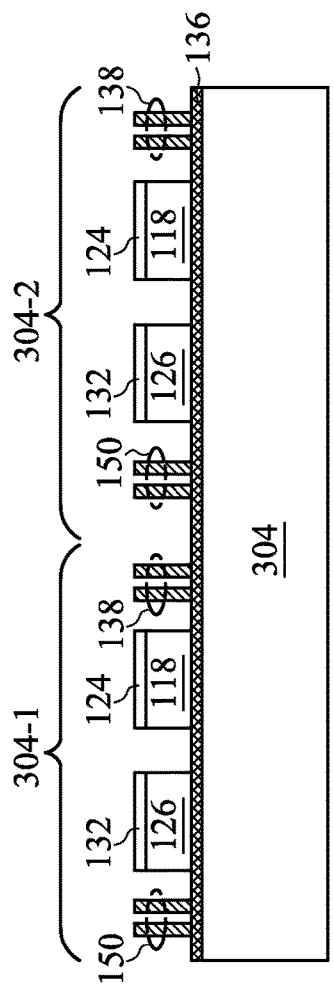
FIGS. 3A to 3P show a process flow illustrating a method of forming the multi-chip package shown in FIG. 1, in accordance with an embodiment.
Figure 3D:
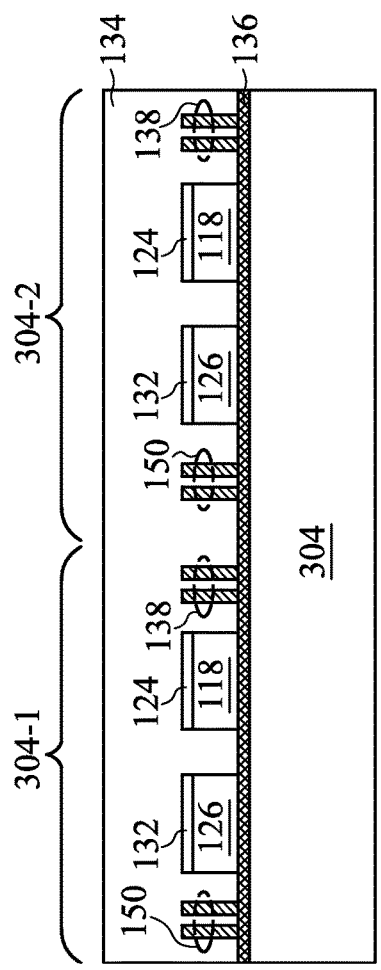
Figure 3G:
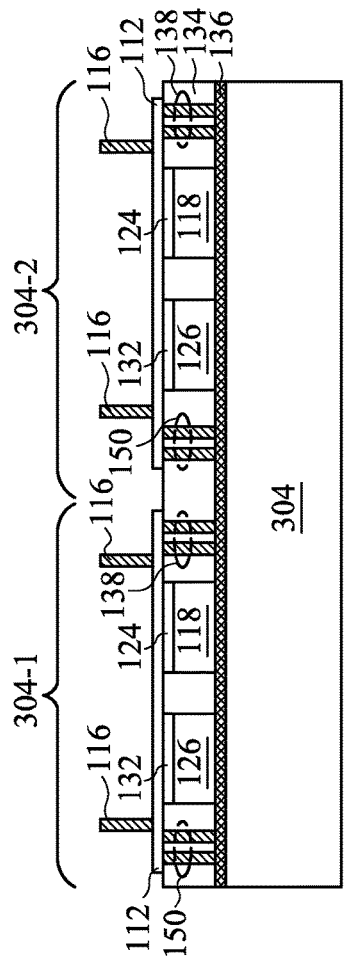
Figure 3H:
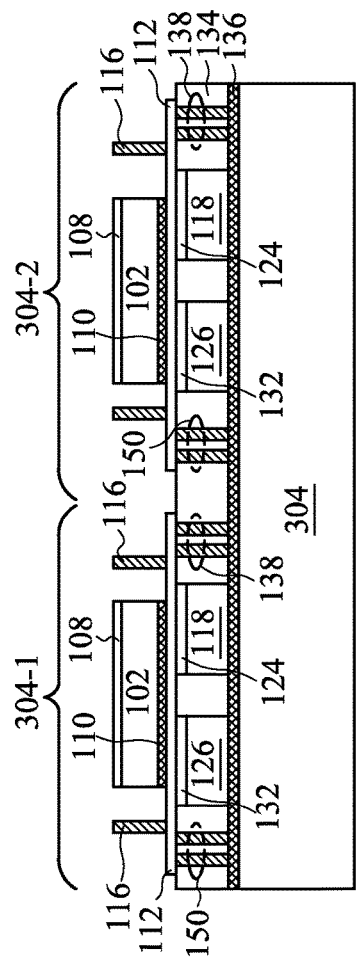
Figure 3K:
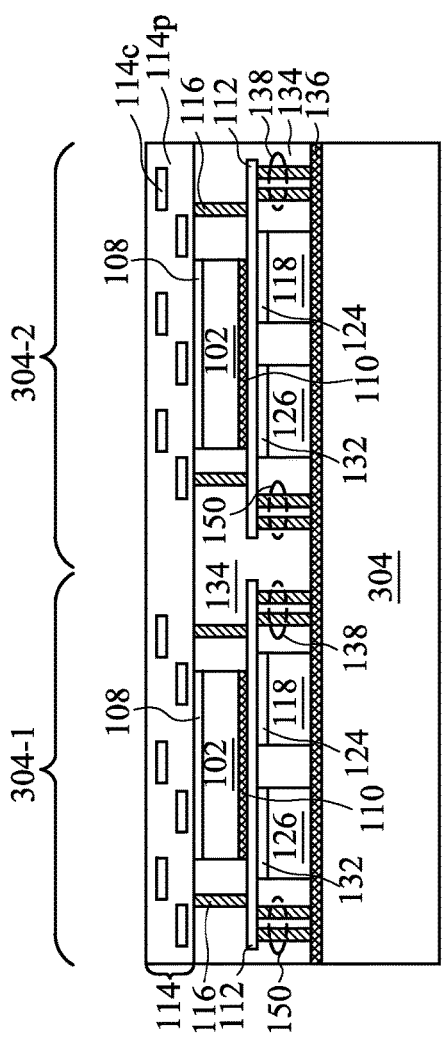
Figure 3L:
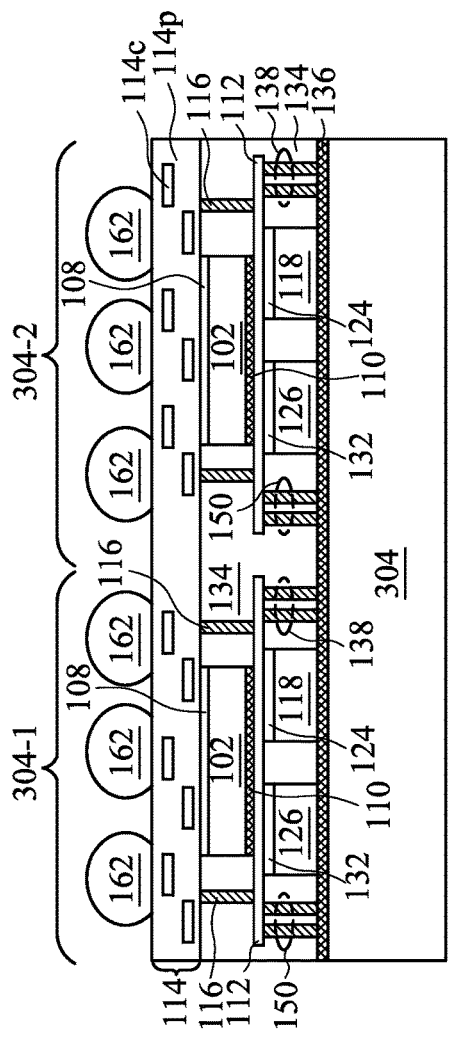
Figure 3O:
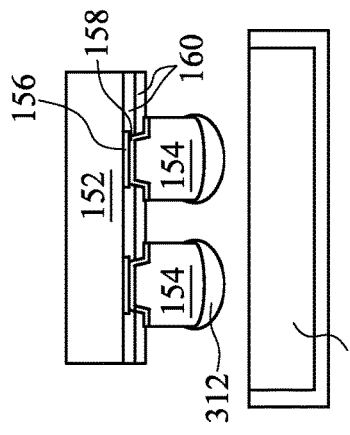
Figure 3P:
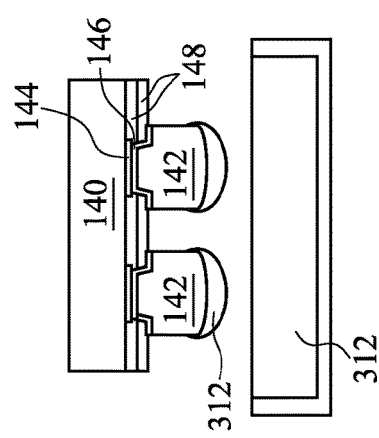
Figure 3P:
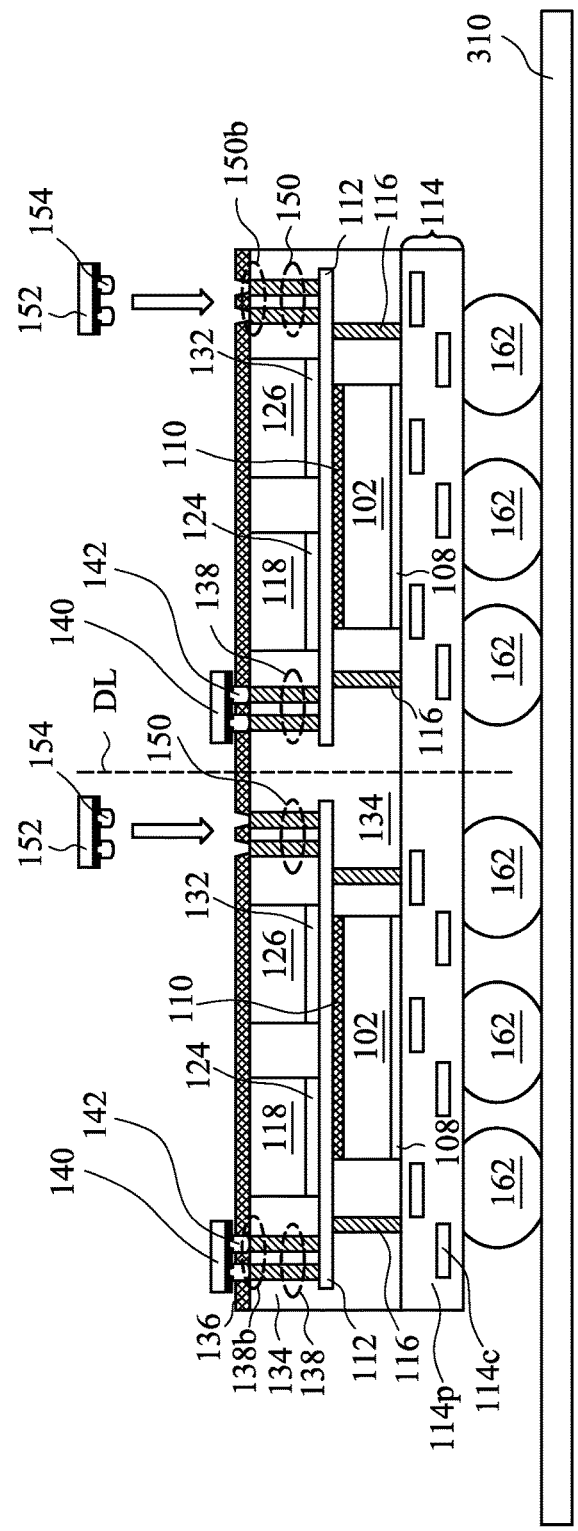

FIGS. 3A to 3P show a process flow illustrating a method of forming the multi-chip package 100, in accordance with one or more embodiments. For the sake of clarity, certain features of the multi-chip package 100 have been simplified in its representation in FIGS. 3A to 3P. Referring to FIG. 3A, the second adhesive layer 136 may be formed over a first carrier 304 (e.g. by a process that rolls and attaches the second adhesive layer 136 to the first carrier 304). The first carrier 304 provides temporary mechanical and structural support to the features of the package 100 that are formed during subsequent processing steps. The first carrier 304 may include, for example, glass, silicon, silicon oxide, aluminum oxide, and the like. The first carrier 304 may, as an example, be a carrier wafer, and a plurality of packages 100 may be formed over the first carrier 304. As an example, a first package 100 may be formed in a first portion 304-1 of the first carrier 304, while a second package 100 may be formed (e.g. simultaneously formed) in a second portion 304-2 of the first carrier 304.

Referring to FIG. 3B, in each of the first portion 304-1 and the second portion 304-2 of the first carrier 304, the one or more second conductive vias 138 and the one or more third conductive vias 150 are formed over the second adhesive layer 136. The one or more second conductive vias 138 and the one or more third conductive vias 150 may be formed by any suitable techniques such as electroplating. In some embodiments, openings corresponding to the locations of the one or more second conductive vias 138 and the one or more third conductive vias 150 may be formed in the second adhesive layer 136 (e.g. by a drilling process). A seed layer may subsequently be formed in these openings and the one or more second conductive vias 138 and the one or more third conductive vias 150 may be plated over the seed layer. Other processes of formation such as sputtering, evaporation, PECVD and/or the like may alternatively be used depending upon the desired materials.

Referring to FIG. 3C, in each of the first portion 304-1 and the second portion 304-2 of the first carrier 304, the second chip 118 and the third chip 126 may be formed over the second adhesive layer 136. The second chip 118 may be laterally separated from the third chip 126 and may additionally be proximal the one or more second conductive vias 138. The third chip 126 may be laterally separated from the second chip 118 and may additionally be proximal the one or more third conductive vias 150. As shown in FIG. 3C, the second insulating layer 124 may be formed over the first surface 118a of the second chip 118, while the third insulating layer 132 may be formed over the first surface 126a of the third chip 126. The second conductive pillars 122 and the third conductive pillars 130 are disposed within the second insulating layer 124 and the third insulating layer 132, respectively. The second conductive pillars 122 and the third conductive pillars 130 have been omitted in FIG. 3C for the sake of clarity.

In the example shown in FIGS. 3B and 3C, the second chip 118 and the third chip 126 are attached to the second adhesive layer 136 after the formation of the one or more second conductive vias 138 and the one or more third conductive vias 150. However, this order of steps is merely illustrative; in other embodiments, the second chip 118 and the third chip 126 are attached to the second adhesive layer 136 prior to the formation of the one or more second conductive vias 138 and the one or more third conductive vias 150.

Referring to FIG. 3D, in each of the first portion 304-1 and the second portion 304-2 of the first carrier 304, the molding compound 134 may be formed over the second chip 118 and the third chip 126. The molding compound 134 may additionally be formed around and over the one or more second conductive vias 138 and the one or more third conductive vias 150. In some embodiments, the molding compound 134 is shaped or molded using for example, a mold (not shown) which may have a border or other feature for retaining molding compound 134 when applied. Such a mold may be used to pressure mold the molding compound 134 over and around the second chip 118, the third chip 126, the one or more second conductive vias 138, and the one or more third conductive vias 150 to force the molding compound 134 into openings and recesses, eliminating air pockets or the like in the molding compound 134.

Referring to FIG. 3E, a first thinning process 306 may be performed on the molding compound 134 to expose the first ends 138a and 150a of the one or more second conductive vias 138 and the one or more third conductive vias 150. The second conductive pillars 122 and the third conductive pillars 130 respectively disposed within the second insulating layer 124 and the third insulating layer 132 may also be exposed by the first thinning process 306. The first thinning process 306 may be performed using an etching process and/or a planarization process, such as a mechanical grinding process or a chemical mechanical polishing (CMP) process.

Referring to FIG. 3F, in each of the first portion 304-1 and the second portion 304-2 of the first carrier 304, the backside RDL 112 may be formed over the one or more second conductive vias 138, the one or more third conductive vias 150, the second chip 118, and the third chip 126. The backside RDL 112 may be formed using one or more of the processes described above in relation to FIG. 1. The conductive features 112c of the backside RDL 112 may be coupled (e.g. electrically and/or physically coupled) to the one or more second conductive vias 138, the one or more third conductive vias 150, the second conductive pillars 122, and the third conductive pillars 130. The conductive features 112c of the backside RDL 112 are omitted from FIG. 3F for the sake of clarity.

Referring to FIG. 3G, in each of the first portion 304-1 and the second portion 304-2 of the first carrier 304, the one or more first conductive vias 116 may be formed over the backside RDL 112, e.g. using similar processes as the one or more second conductive vias 138 and the one or more third conductive vias 150. The one or more first conductive vias 116 may be coupled (e.g. electrically and/or physically coupled) to the conductive features 112c of the backside RDL 112. As an example, some of the conductive features 112c of the backside RDL 112 may be exposed (e.g. by a laser opening process and/or etching process), and the one or more first conductive vias 116 may thereafter be formed over the exposed conductive features 112c of the backside RDL 112.

Referring to FIG. 3H, in each of the first portion 304-1 and the second portion 304-2 of the first carrier 304, the first chip 102 may be disposed (e.g. picked and placed) over the backside RDL 112 and laterally adjacent to the one or more first conductive vias 116. As shown in FIG. 3H, the second surface 102b of the first chip 102 may have the first adhesive layer 110 disposed thereon. Consequently, the first chip 102 may be attached to the backside RDL 112 by means of the first adhesive layer 110. As shown in FIG. 3H, the first insulating layer 108 may be formed over the first surface 102a of the first chip 102. The first conductive pillars 106 are disposed within the first insulating layer 108. The first conductive pillars 106 have been omitted in FIG. 3H for the sake of clarity.

In the example of FIGS. 3G and 3H, the first chip 102 is attached to the backside RDL 112 (using the first adhesive layer 110) after the formation of the one or more first conductive vias 116. However, this order of steps is merely illustrative; in other embodiments, the first chip 102 is attached to the backside RDL 112 prior to the formation of the one or more first conductive vias 116.

Referring to FIG. 3I, in each of the first portion 304-1 and the second portion 304-2 of the first carrier 304, the molding compound 134 may be formed over the first chip 102 and the one or more first conductive vias 116, e.g. using one or more of the processes described above in relation to FIG. 3D. Additionally, the molding compound 134 may fully encapsulate the backside RDL 112.

Referring to FIG. 3J, a second thinning process 308 may be performed on the molding compound 134 to expose the one or more first conductive vias 116 and the first conductive pillars 106 disposed within the first insulating layer 108. The second thinning process 308 may be similar to the first thinning process 306.

Referring to FIG. 3K, in each of the first portion 304-1 and the second portion 304-2 of the first carrier 304, the frontside RDL 114 may be formed, e.g. using one or more of the processes described above in relation to FIG. 1. The conductive features 114c of the frontside RDL 114 may be coupled (e.g. electrically and/or physically coupled) to the one or more first conductive vias 116 and the first conductive pillars 106 disposed within the first insulating layer 108.

Referring to FIG. 3L, in each of the first portion 304-1 and the second portion 304-2 of the first carrier 304, some of the conductive features 114c of the frontside RDL 114 may be exposed (e.g. by a laser opening process and/or etching process), and the external connectors 162 may thereafter be formed over the exposed conductive features 114c of the frontside RDL 114 (e.g. by a BGA mounting process).

Referring to FIG. 3M, the first carrier 304 may be inverted and the external connectors 162 may be mounted (e.g. frame mounted) onto a dicing tape 310. Additionally, the first carrier 304 may be debonded from the second adhesive layer 136. For example, a thermal debonding process or a laser debonding process may be utilized, depending upon the precise adhesive or DAF chosen for the second adhesive layer 136. As a consequence, the second adhesive layer 136 covers the second end 138b of the one or more second conductive vias 138 and the second end 150b of the one or more third conductive vias 150.

In the following steps, the second ends 138b and 150b of the one or more second conductive vias 138 and the one or more third conductive vias 150 may be exposed, e.g. in order to make contact (e.g. physical and/or electrical contact) thereto. For example, referring to FIG. 3N, the one or more openings 202 may be formed (e.g. by a drilling process) in the second adhesive layer 136, e.g. to expose the second ends 138b and 150b of the one or more second conductive vias 138 and the one or more third conductive vias 150. The one or more openings 202 may be aligned with the second ends 138b and 150b of the one or more second conductive vias 138 and the one or more third conductive vias 150. The one or more openings 202 may be formed by a laser opening process and/or etching process, although other processes may be possible as well. As described above in relation to FIG. 2, the portions of the second ends 138b and 150b of the one or more second conductive vias 138 and the one or more third conductive vias 150 exposed by the one or more openings 202 may have the lateral dimension A that may be about 15 micrometers to about 20 micrometers smaller than the lateral dimension D of the one or more third conductive vias 150 and the one or more second conductive vias 138.

Referring to FIG. 3O, the one or more first conductive elements 142 may be formed over the fourth contact pads 144 of the fourth chip 140. In like manner, the one or more second conductive elements 154 may be formed over the fifth contact pads 156 of the fifth chip 152. In some embodiments, as in the example of FIG. 3O, the one or more first conductive elements 142 may be dipped in a flux 312 such that surfaces of the one or more first conductive elements 142 facing away from the fourth chip 140 are coated with the flux 312. In like manner, the one or more second conductive elements 154 may be dipped in the flux 312 such that surfaces of the one or more second conductive elements 154 facing away from the fifth chip 152 are coated with the flux 312.

Referring to FIG. 3P, the fourth chip 140 may be coupled (e.g. electrically coupled) to the second end 138b of the one or more second conductive vias 138 using the one or more first conductive elements 142. As an example, the fourth chip 140 may be picked and placed over the one or more openings 202 that expose the second end 138b of the one or more second conductive vias 138. Thereafter, the fourth chip 140 may be brought into contact (e.g. electrical contact) with the one or more second conductive vias 138 by placing or positioning the one or more first conductive elements 142 into the one or more openings 202 and performing a reflow process, thereby coupling the one or more first conductive elements 142 to the one or more second conductive vias 138. Following this a flux clean process may be performed on the one or more first conductive elements 142.

In like manner, the fifth chip 152 may be coupled (e.g. electrically coupled) to the second end 150b of the one or more third conductive vias 150 using the one or more second conductive elements 154. As an example, the fifth chip 152 may be picked and placed over the one or more openings 202 that expose the second end 150*b* of the one or more third conductive vias 150. Thereafter, the fifth chip 152 may be brought into contact (e.g. electrical contact) with the one or more third conductive vias 150 by placing or positioning the one or more second conductive elements 154 into the one or more openings 202 and performing a reflow process, thereby coupling the one or more second conductive elements 154 to the one or more third conductive vias 150. Following this a flux clean process may be performed on the one or more second conductive elements 154.

Following this, the structure shown in FIG. 3P may be singulated or diced (e.g. along dicing line DL), thereby forming a plurality of packages, each of which may be substantially identical to the package 100 shown in FIG. 1. As described above in relation to FIG. 1, the fourth chip 140 and the fifth chip 152 may be free from the molding compound 134 and may be disposed at a side of the second adhesive layer 136 facing away from the molding compound 134. Consequently, the additional chips that is not encapsulated in the molding compound 134 (e.g. the fourth chip 140 and the fifth chip 152) may be mounted on or at a backside of the package 100 and electrically connected to the chips may be encapsulated in the molding compound 134 (e.g. the first chip 102, the second chip 118, and/or the third chip 126). Consequently, the backside of the package 100 may be used to expand a functionality of the package 100 and increase the functional density and/or integration density of the package 100.

The examples shown thus far increase the functional density and/or integration density of the package 100 by mounting chips on the backside of the package 100 and electrically connecting these mounted chips to the first chip 102, the second chip 118, and/or the third chip 126 encapsulated in the molding compound 134. However, the backside of the package 100 may also be used for features other than chips. An example of such a package is shown in FIG. 4.

Figure 4:
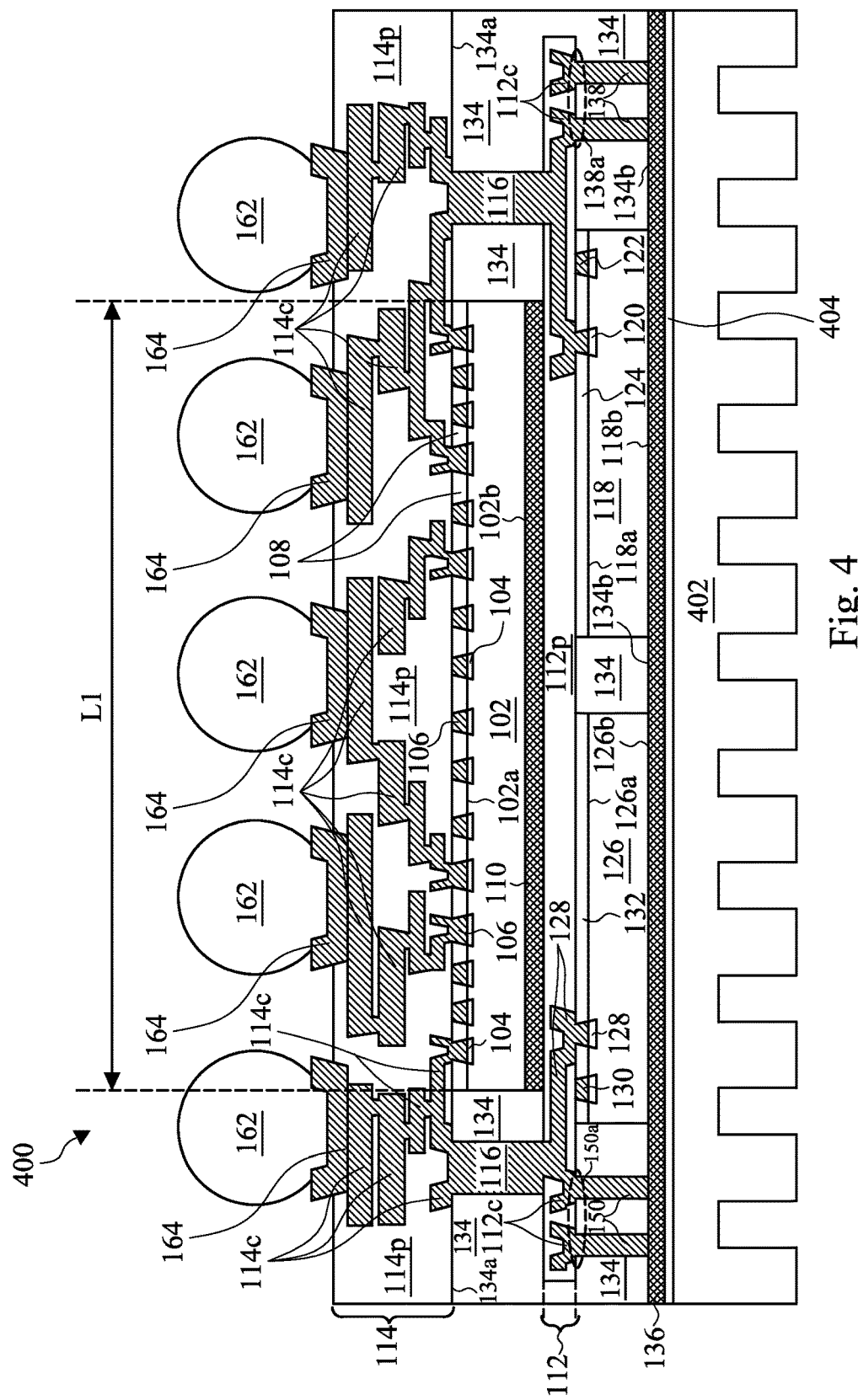
FIG. 4 shows a multi-chip package comprising a heat sink, in accordance with an embodiment.

FIG. 4 shows a multi-chip package 400 comprising a heat sink 402, in accordance with one or more embodiments. As shown in FIG. 4, the heat sink 402 may be attached to the second adhesive layer 136 by a third adhesive layer 404, which may comprise similar materials as the second adhesive layer 136. In some embodiments, the third adhesive layer 404 may additionally be a good conductor of heat. In the example of FIG. 4, the at least one second conductive via 138 and/or the at least one third conductive via 150 may function as heat conduction features that conduct heat from the first chip 102, the second chip 118, and/or the third chip 126 to the heat sink 402, e.g. through the second adhesive layer 136 and the third adhesive layer 404. Consequently, the heat sink 402 may be thermally coupled to the at least one second conductive via 138 and/or the at least one third conductive via 150.

Figure 5A:
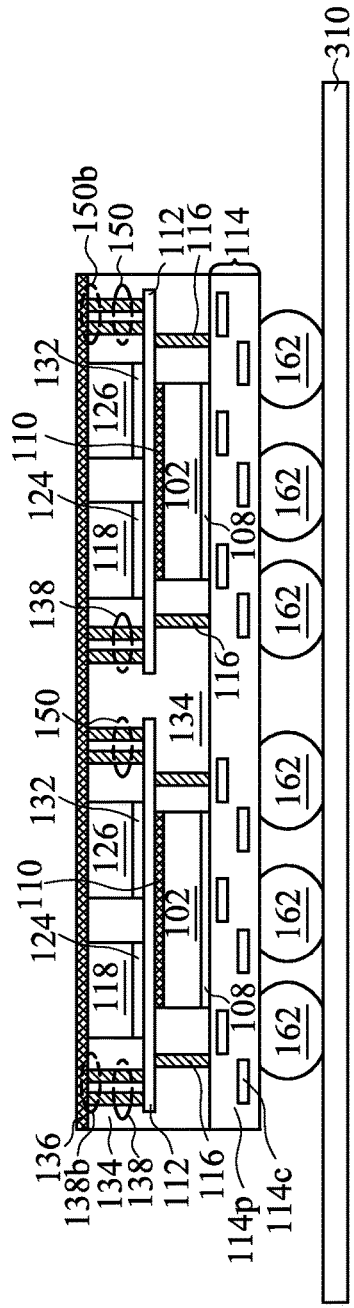
FIGS. 5A to 5B show a process flow illustrating a method of forming the multi-chip package shown in FIG. 4, in accordance with an embodiment.
Figure 5B:
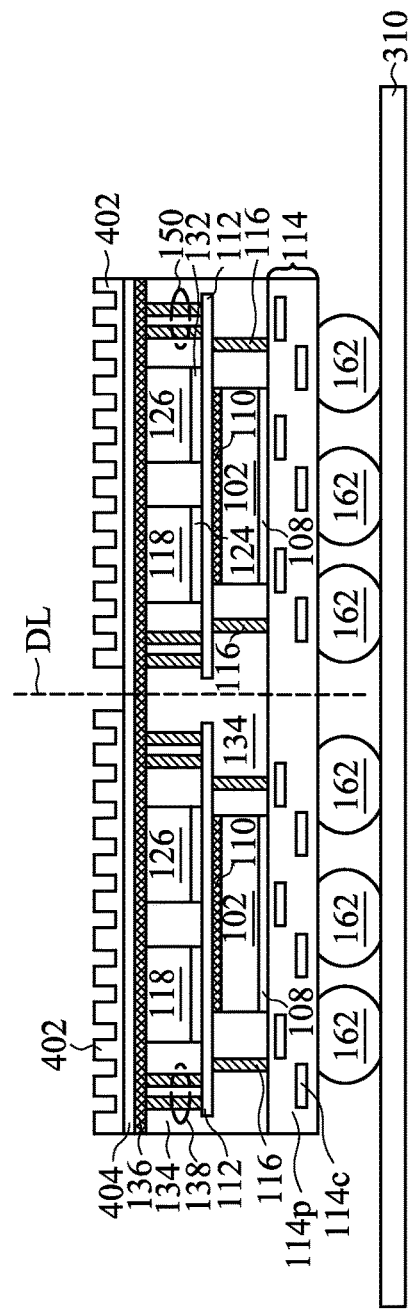

FIGS. 5A to 5B show a process flow illustrating a method of forming the multi-chip package 400, in accordance with one or more embodiments. FIG. 5A may, as an example, be identified with FIG. 3M. Consequently, the structure shown in FIG. 5A may be manufactured using the steps described above in relation to FIGS. 3A to 3M. As shown in FIG. 5A, the first carrier 304 may be inverted and the external connectors 162 may be mounted (e.g. frame mounted) onto the dicing tape 310. Additionally, the first carrier 304 may be debonded or demounted from the second adhesive layer 136.

Referring to FIG. 5B, the heat sink 402 may be attached to the second adhesive layer 136 (e.g. using the third adhesive layer 404). Each package 400 may have a respective heat sink 402 attached thereto, as shown in FIG. 5B.

Following this, the structure shown in FIG. 5B may be singulated or diced (e.g. along dicing line DL), thereby forming a plurality of packages, each of which may be substantially identical to the package 400 shown in FIG. 4. As described above in relation to FIG. 4, the heat sink 4022 may be disposed at a side of the second adhesive layer 136 facing away from the molding compound 134. Consequently, the heat sink 402 may function to dissipate heat generated in the chips may be encapsulated in the molding compound 134 (e.g. the first chip 102, the second chip 118, and/or the third chip 126). Consequently, the backside of the package 100 may be used to expand a functionality of the package 100 and increase the functional density and/or integration density of the package 100.

The process flows shown in FIGS. 3A to 3P and FIGS. 5A and 5B illustrate examples where the package 100 and the package 400 are manufacturing from the backside to the frontside. However, in other embodiments, the package 100 and/or the package 400 may be manufactured from the frontside to the backside. An example of such an embodiment is shown in FIGS. 6A to 6N.

Figure 6C:
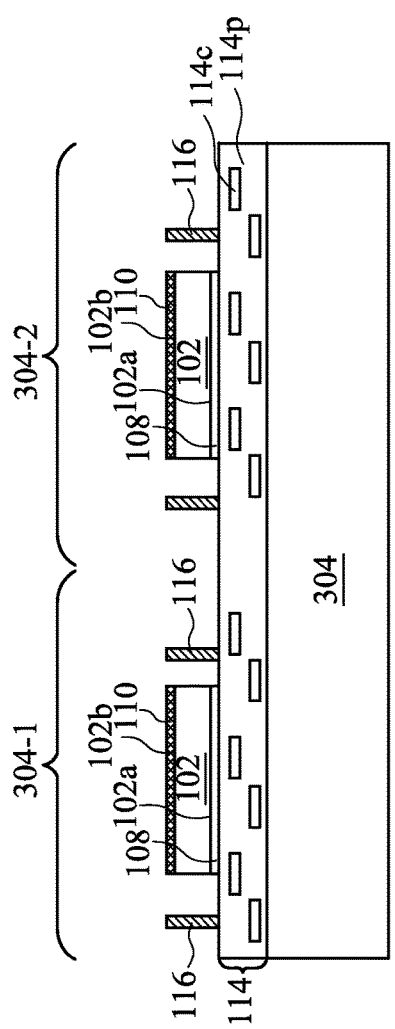
FIGS. 6A to 6N show a process flow illustrating a method of forming the multi-chip package shown in FIG. 1, in accordance with an embodiment.
Figure 6D:
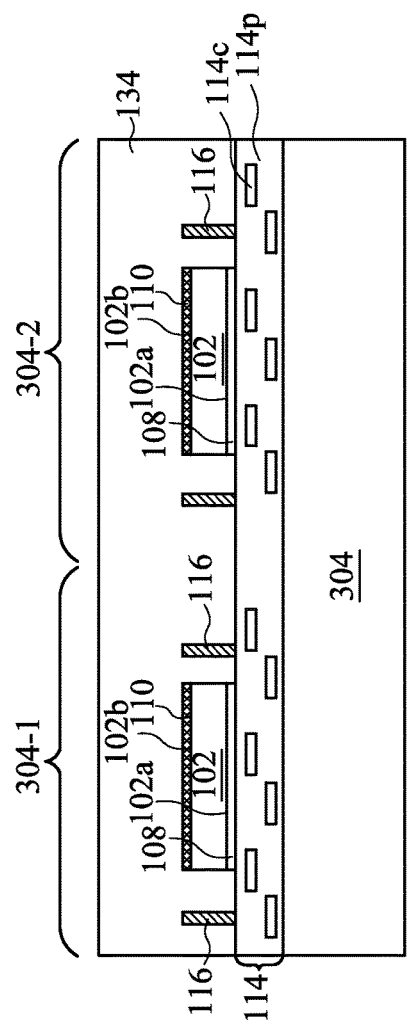
Figure 6K:
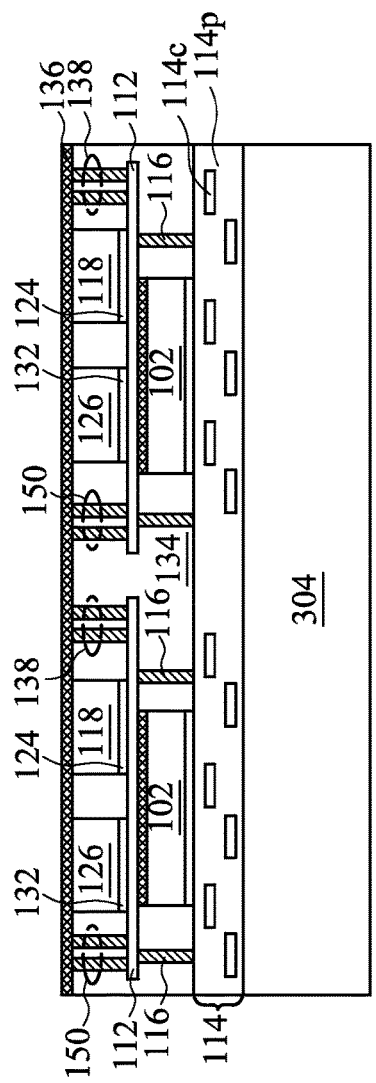
Figure 6L:
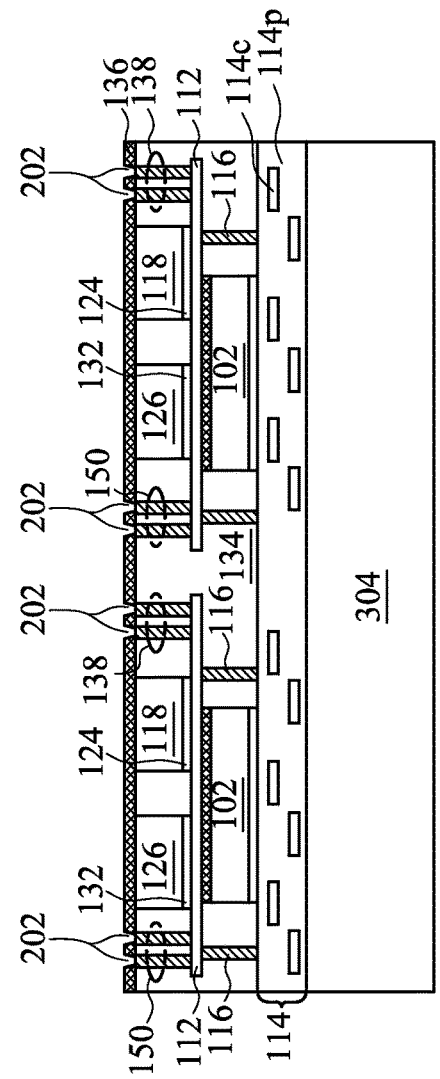
Figure 6M:
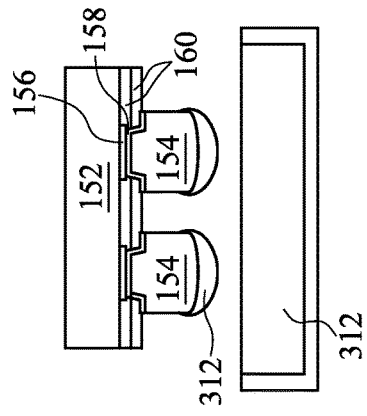
Figure 6N:
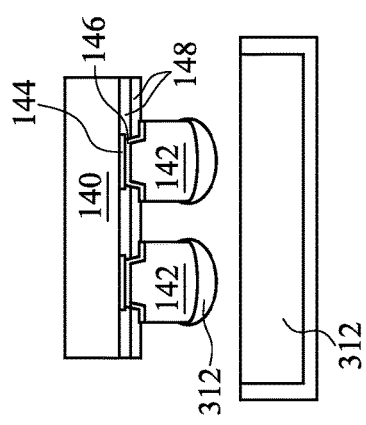
Figure 6N:
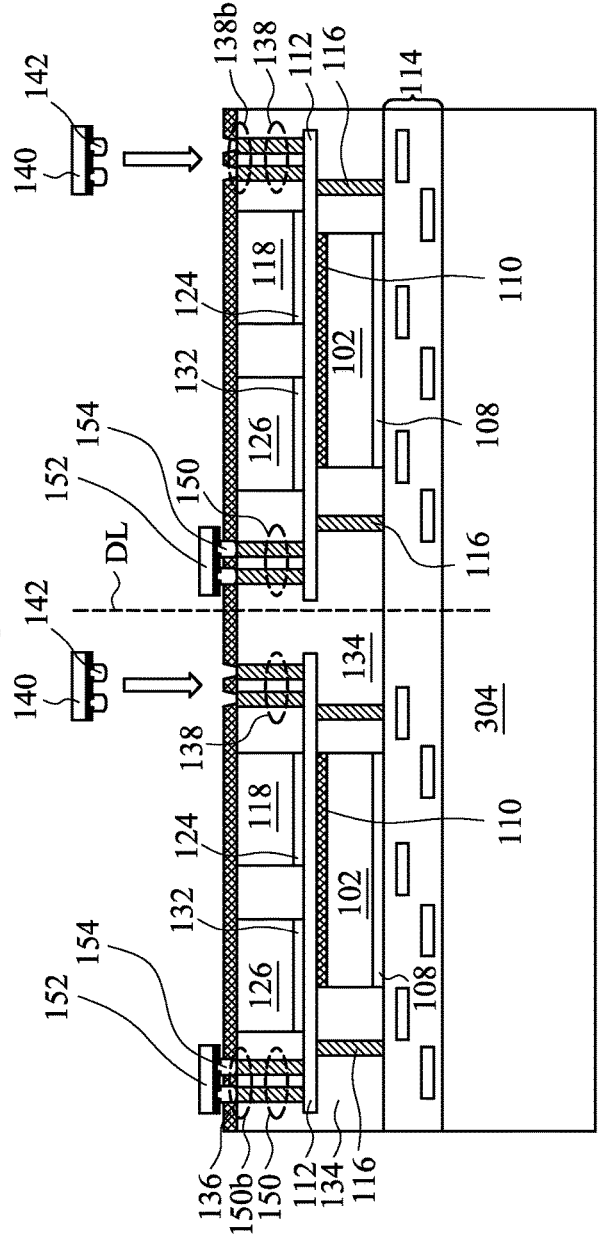

FIGS. 6A to 6N show a process flow illustrating a method of forming the multi-chip package 100, in accordance with one or more embodiments. For the sake of clarity, certain features of the multi-chip package 100 have been simplified in its representation in FIGS. 6A to 6N. Referring to FIG. 6A, the frontside RDL 114 may be formed over the first carrier 304, e.g. using one or more of the processes described above in relation to FIG. 1. Referring to FIG. 6B, in each of the first portion 304-1 and the second portion 304-2 of the first carrier 304, the one or more first conductive vias 116 is formed over the first carrier 304. The one or more first conductive vias 116 may be formed by any suitable techniques such as electroplating. Other processes of formation such as sputtering, evaporation, PECVD and/or the like may alternatively be used depending upon the desired materials. In forming the one or more first conductive vias 116, some of the conductive features 114*c* of the frontside RDL 114 may be exposed (e.g. by a laser opening process and/or etching process), and the one or more first conductive vias 116 may thereafter be formed over the exposed conductive features 114*c* of the frontside RDL 114.

Referring to FIG. 6C, in each of the first portion 304-1 and the second portion 304-2 of the first carrier 304, the first chip 102 may be coupled to the frontside RDL 114. In the example shown in FIG. 6C, the first surface 102*a* of the first chip 102 faces the frontside RDL 114. As shown in FIG. 6C, the first insulating layer 108 may be formed at the first surface 102*a* of the first chip 102 and may be disposed between the frontside RDL 114 and the first surface 102*a* of the first chip 102. Additionally, the first adhesive layer 110 may be disposed at the second surface 102*b* of the first chip 102. The first conductive pillars 106 are disposed within the first insulating layer 108. The first conductive pillars 106 have been omitted in FIG. 6C for the sake of clarity. In coupling the first chip 102 to the frontside RDL 114, some of the conductive features 114*c* of the frontside RDL 114 may be exposed (e.g. by a laser opening process and/or etching process), and the first conductive pillars 106 may thereafter be coupled to the exposed conductive features 114*c* of the frontside RDL 114.

In the example of FIGS. 6B and 6C, the first chip 102 is coupled to the frontside RDL 114 after the formation of the one or more first conductive vias 116. However, this order of steps is merely illustrative; in other embodiments, the first chip 102 is coupled to the frontside RDL 114 prior to the formation of the one or more first conductive vias 116.

Referring to FIG. 6D, in each of the first portion 304-1 and the second portion 304-2 of the first carrier 304, the molding compound 134 may be formed over the first chip 102. The molding compound 134 may additionally be formed around and over the one or more first conductive vias 116. In some embodiments, the molding compound 134 is shaped or molded using for example, a mold (not shown) which may have a border or other feature for retaining molding compound 134 when applied. Such a mold may be used to pressure mold the molding compound 134 over and around the first chip 102 and the one or more first conductive vias 116 to force the molding compound 134 into openings and recesses, eliminating air pockets or the like in the molding compound 134.

Referring to FIG. 6E, a third thinning process 602 may be performed on the molding compound 134 to one or more first conductive vias 116 and the first adhesive layer 110. The third thinning process 602 may be substantially similar to the first thinning process 306, as an example. Referring to FIG. 6F, in each of the first portion 304-1 and the second portion 304-2 of the first carrier 304, the backside RDL 112 may be formed over the one or more first conductive vias 116 and the first adhesive layer 110. The backside RDL 112 may be formed using one or more of the processes described above in relation to FIG. 1. The conductive features 112c of the backside RDL 112 may be coupled (e.g. electrically and/or physically coupled) to the one or more first conductive vias 116. The conductive features 112c of the backside RDL 112 are omitted from FIG. 6F for the sake of clarity.

Referring to FIG. 6G, in each of the first portion 304-1 and the second portion 304-2 of the first carrier 304, the one or more second conductive vias 138 and the one or more third conductive vias 150 are formed over and coupled to the backside RDL 112. The one or more second conductive vias 138 and the one or more third conductive vias 150 may be formed by any suitable techniques such as electroplating. Other processes of formation such as sputtering, evaporation, PECVD and/or the like may alternatively be used depending upon the desired materials. In forming the one or more second conductive vias 138 and the one or more third conductive vias 150, some of the conductive features 112c of the backside RDL 112 may be exposed (e.g. by a laser opening process and/or etching process), and the one or more second conductive vias 138 and the one or more third conductive vias 150 may thereafter be formed over the exposed conductive features 112c of the backside RDL 112.

Referring to FIG. 6H, in each of the first portion 304-1 and the second portion 304-2 of the first carrier 304, the second chip 118 and the third chip 126 may be coupled to the backside RDL 112. In the example shown in FIG. 6G, the first surfaces 118a and 126a of the second chip 118 and the third chip 126 face the backside RDL 112. As shown in FIG. 6H, the second insulating layer 124 and third insulating layer 132 may be respectively formed at the first surfaces 118a and 126a of the second chip 118 and the third chip 126. The second conductive pillars 120 and the third conductive pillars 130 are respectively disposed within the second insulating layer 124 and the third insulating layer 132. The second conductive pillars 120 and the third conductive pillars 130 have been omitted in FIG. 6H for the sake of clarity. In coupling the second chip 118 and the third chip 126 to the backside RDL 112, some of the conductive features 112c of the backside RDL 112 may be exposed (e.g. by a laser opening process and/or etching process), and the second conductive pillars 120 and the third conductive pillars 130 may thereafter be coupled to the exposed conductive features 112c of the backside RDL 112.

In the example of FIGS. 6G and 6H, the second chip 118 and the third chip 126 are coupled to the backside RDL 112 after the formation of the one or more second conductive vias 138 and the one or more third conductive vias 150. However, this order of steps is merely illustrative; in other embodiments, the second chip 118 and the third chip 126 are coupled to the backside RDL 112 prior to the formation of the one or more second conductive vias 138 and the one or more third conductive vias 150.

Referring to FIG. 6I, in each of the first portion 304-1 and the second portion 304-2 of the first carrier 304, the molding compound 134 may be formed over the second chip 118, the third chip 126, the one or more second conductive vias 138, and the one or more third conductive vias 150, e.g. using one or more of the processes described above in relation to FIG. 6D. Additionally, the molding compound 134 may fully encapsulate the backside RDL 112.

Referring to FIG. 6J, a fourth thinning process 604 may be performed on the molding compound 134 to expose the one or more second conductive vias 138, and the one or more third conductive vias 150. The fourth thinning process 604 may be similar to the first thinning process 306. The fourth thinning process 604 may additionally expose surfaces of the second chip 118 and the third chip 126 facing away from the first chip 102. Referring to FIG. 6K, the second adhesive layer 136 may be formed on the surface of the molding compound 134 facing away from the frontside RDL 114.

Referring to FIG. 6L, the one or more openings 202 may be formed in the second adhesive layer 136, e.g. to expose the one or more second conductive vias 138 and the one or more third conductive vias 150. The one or more openings 202 may be aligned with the one or more second conductive vias 138 and the one or more third conductive vias 150. The one or more openings 202 may be formed by a laser opening process and/or etching process, although other processes may be possible as well. As described above in relation to FIG. 2, the portions of the one or more second conductive vias 138 and the one or more third conductive vias 150 exposed by the one or more openings 202 may have the lateral dimension A that may be about 15 micrometers to about 20 micrometers smaller than the lateral dimension D of the one or more third conductive vias 150 and the one or more second conductive vias 138.

Referring to FIG. 6M, the one or more first conductive elements 142 may be formed over the fourth contact pads 144 of the fourth chip 140. In like manner, the one or more second conductive elements 154 may be formed over the fifth contact pads 156 of the fifth chip 152. In some embodiments, as in the example of FIG. 3O, the one or more first conductive elements 142 may be dipped in a flux 312 such that surfaces of the one or more first conductive elements 142 facing away from the fourth chip 140 are coated with the flux 312. In like manner, the one or more second conductive elements 154 may be dipped in the flux 312 such that surfaces of the one or more second conductive elements 154 facing away from the fifth chip 152 are coated with the flux 312.

Referring to FIG. 6N, the fourth chip 140 may be coupled (e.g. electrically coupled) to the second end 138b of the one or more second conductive vias 138 using the one or more first conductive elements 142. As an example, the fourth chip 140 may be picked and placed over the one or more openings 202 that expose the second end 138b of the one or more second conductive vias 138. Thereafter, the fourth chip 140 may be brought into contact (e.g. electrical contact) with the one or more second conductive vias 138 by placing or positioning the one or more first conductive elements 142 into the one or more openings 202 and performing a reflow process, thereby coupling the one or more first conductive elements 142 to the one or more second conductive vias 138. Following this a flux clean process may be performed on the one or more first conductive elements 142.

In like manner, the fifth chip 152 may be coupled (e.g. electrically coupled) to the second end 150b of the one or more third conductive vias 150 using the one or more second conductive elements 154. As an example, the fifth chip 152 may be picked and placed over the one or more openings 202 that expose the second end 150b of the one or more third conductive vias 150. Thereafter, the fifth chip 152 may be brought into contact (e.g. electrical contact) with the one or more third conductive vias 150 by placing or positioning the one or more second conductive elements 154 into the one or more openings 202 and performing a reflow process, thereby coupling the one or more second conductive elements 154 to the one or more third conductive vias 150. Following this a flux clean process may be performed on the one or more second conductive elements 154.

Following this, the structure shown in FIG. 6N may be debonded or demounted from the first carrier 304 and subsequently singulated or diced (e.g. along dicing line DL), thereby forming a plurality of packages, each of which may be substantially identical to the package 100 shown in FIG. 1. As described above in relation to FIG. 1, the fourth chip 140 and the fifth chip 152 may be free from the molding compound 134 and may be disposed at a side of the second adhesive layer 136 facing away from the molding compound 134. Consequently, the additional chips that is not encapsulated in the molding compound 134 (e.g. the fourth chip 140 and the fifth chip 152) may be mounted on or at a backside of the package 100 and electrically connected to the chips may be encapsulated in the molding compound 134 (e.g. the first chip 102, the second chip 118, and/or the third chip 126). Consequently, the backside of the package 100 may be used to expand a functionality of the package 100 and increase the functional density and/or integration density of the package 100.

According to various embodiments presented herein, a package is provided. The package may include: a first chip having a first surface and a second surface opposite the first surface; a first redistribution line (RDL) coupled to the first surface of the first chip; a second chip having a first surface and a second surface opposite the first surface, the first surface of the second chip facing the first chip; a second RDL disposed between the first chip and the second chip and coupled to the first surface of the second chip; a conductive via laterally adjacent to the second chip, the conductive via coupled to the second RDL; and a molding compound disposed between the second chip and the conductive via.

According to various embodiments presented herein, a package is provided. The package may include: a frontside redistribution layer (RDL); a backside RDL; a first chip disposed between the frontside RDL and the backside RDL, the first chip coupled to the frontside RDL; a first conductive via laterally separated from the first chip and coupled to the backside RDL and the frontside RDL; a second chip facing the first chip, the backside RDL disposed between the first chip and the second chip, the backside RDL coupled to the second chip; a second conductive via laterally separated from the second chip and coupled to the backside RDL; and a molding compound at least partially encapsulating the first chip, the backside RDL, the first conductive via, the second chip, and the second conductive via.

According to various embodiments presented herein, a method of manufacturing a package is provided. The method may include: forming a first redistribution layer (RDL) over a carrier; disposing a first chip over the first RDL, the first chip electrically coupled to the first RDL; encapsulating the first chip in a first molding compound; forming a second RDL over a surface of the first chip, the first chip disposed between the first RDL and the second RDL; disposing a second chip over the second RDL, the second RDL disposed between the first chip and the second chip; forming one or more conductive vias over the second RDL and laterally separated from the second chip, the one or more conductive vias electrically coupled to the second RDL; and encapsulating the second chip and the one or more conductive vias in a second molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
a first chip having a first surface and a second surface opposite the first surface, the first surface comprising contact pads having surfaces facing away from the first chip, wherein surfaces of the contact pads are substantially coplanar with the first surface of the first chip;
a first redistribution line (RDL) being in direct contact with surfaces of the contact pads of the first surface of the first chip;
a first molding compound extending along sidewalls of the first chip;
a second chip having a first surface and a second surface opposite the first surface, the first surface of the second chip facing the first chip;
a second RDL disposed between the first chip and the second chip and coupled to the first surface of the second chip, wherein the first molding compound extends along sidewalls of the second RDL;
a first adhesive layer disposed between the first chip and the second RDL, the first adhesive layer extending continuously along the second surface of the first chip;
a conductive via laterally adjacent to the second chip, the conductive via coupled to the second RDL;
a second molding compound disposed between the second chip and the conductive via, the first molding compound being a different layer than the second molding compound;
a third chip laterally separated from the second chip, the third chip coupled to the second RDL, the third chip having a first surface and a second surface opposite the first surface, the first surface of the third chip facing the first chip; and
a second adhesive layer disposed at the second surface of the second chip and at the second surface of the third chip, the second adhesive layer extending continuously between opposite ends of the second chip and the third chip.

2. The package of claim 1, wherein a surface of the conductive via facing away from the second RDL is substantially co-planar with the second surface of the second chip.

3. The package of claim 1, further comprising a passive device coupled to the conductive via, the passive device being laterally adjacent to the second chip, the passive device being directly on top of the conductive via laterally adjacent to the second chip.

4. The package of claim 1, further comprising a heat sink adjacent to the second surface of the second chip.

5. The package of claim 1, wherein the second molding compound is further disposed between the third chip and the second chip.

6. The package of claim 1, wherein the first chip is electrically coupled to the second chip.

7. The package of claim 1, wherein the conductive via laterally adjacent to the second chip is in direct contact with an unbroken region of the second adhesive layer.

8. A package, comprising:
a frontside redistribution layer (RDL);
a backside RDL;
a first chip disposed between the frontside RDL and the backside RDL, the first chip coupled to the frontside RDL;
a first adhesive layer between the first chip and the backside RDL, the first adhesive layer being unbroken by conductive vias;
a first conductive via laterally separated from the first chip and coupled to the backside RDL and the frontside RDL;
a second chip facing the first chip, the backside RDL disposed between the first chip and the second chip, the backside RDL coupled to the second chip, the second chip having a first surface and a second surface opposite the first surface, the first surface of the second chip facing the first chip;
a third chip laterally separated from the second chip, the third chip having a first surface and a second surface opposite the first surface, the first surface of the third chip facing the first chip;
a second adhesive layer disposed at the second surface of the second chip and at the second surface of the third chip, the second adhesive layer being continuously planar from the second surface of the second chip to the second surface of the third chip, the second adhesive layer being unbroken by conductive vias between opposite ends of the second chip and the third chip;
a second conductive via laterally adjacent the second chip and coupled to the backside RDL;
a molding compound at least partially encapsulating the first chip, the backside RDL, the first conductive via, the second chip, and the second conductive via;
a semiconductor device disposed at a surface of the molding compound facing away from the frontside RDL, the semiconductor device directly coupled to the second conductive via, an entirety of the semiconductor device being laterally adjacent the second chip in a plan view; and
a conductive connector disposed between the semiconductor device and the second conductive via, the conductive connector being in direct contact with the semiconductor device and the second conductive via.

9. The package of claim 8, wherein a surface of the molding compound facing away from the frontside RDL comprises a backside of the package.

10. The package of claim 8, further comprising a plurality of external connectors coupled to the frontside RDL.

11. The package of claim 8, wherein a lateral dimension of the second conductive via is in a range from about 80 micrometers to about 120 micrometers.

12. The package of claim 8, wherein the second conductive via comprises a plurality of second conductive vias, wherein adjacent ones of the plurality of second conductive vias are separated by a distance in a range from about 200 micrometers to about 400 micrometers.

13. A method of manufacturing a package, the method comprising:
forming a first redistribution layer (RDL) over a carrier;
disposing a first chip over the first RDL, the first chip having a first surface and a second surface opposite the first surface, the first chip is electrically coupled to the first RDL, the first surface comprising contact pads having surfaces facing away from the first chip, the surfaces of the contact pads being substantially coplanar with the first surface of the first chip, wherein the first RDL is in direct contact with surfaces of the contact pads of the first surface of the first chip;
encapsulating the first chip in a first molding compound;
forming a second RDL over the second surface of the first chip, the first chip disposed between the first RDL and the second RDL;
disposing a first adhesive layer between the first chip and the second RDL, the first adhesive layer continuously extending from a first edge of the first chip to a second edge of the first chip, the first edge being opposite to the second edge;
disposing a second chip over the second RDL, the second RDL disposed between the first chip and the second chip, the second chip having a first surface and a second surface opposite the first surface, the first surface of the second chip facing the first chip;
disposing a third chip over the second RDL, the third chip laterally separated from the second chip and having a first surface and a second surface opposite the first surface, the first surface of the third chip facing the first chip;
disposing a second adhesive layer at the second surface of the second chip and at the second surface of the third chip, the second adhesive layer continuously extending between a first edge of the second chip and a second edge of the third chip, the first edge of the second chip being opposite to the second edge of the third chip;
forming one or more conductive vias over the second RDL and laterally separated from the second chip, the one or more conductive vias electrically coupled to the second RDL;
encapsulating the second chip and the one or more conductive vias in a second molding compound; and
forming one or more openings in the second adhesive layer, the one or more openings exposing the one or more conductive vias.

14. The method of claim 13, wherein the second adhesive layer is continuously planar between the first edge of the second chip and the second edge of the third chip.

15. The method of claim 13, further comprising placing a first semiconductor device over the one or more openings in the second adhesive layer, the first semiconductor device electrically coupled to the one or more conductive vias through one or more conductive connectors, wherein, after placing the first semiconductor device over the one or more openings in the second adhesive layer, the one or more conductive connectors are in direct contact with the first semiconductor device and the one or more conductive vias.

16. The method of claim 15, further comprising:
   placing the one or more conductive connectors over respective contact pads of the first semiconductor device; and
   coating the conductive connectors with a flux, wherein placing the first semiconductor device over the one or more openings in the second adhesive layer comprises placing the one or more conductive connectors in the one or more openings in the second adhesive layer, the first semiconductor device being electrically coupled to the one or more conductive vias through the one or more conductive connectors.

17. The method of claim 15, further comprising placing a second semiconductor device over the second adhesive layer, the second semiconductor device being laterally separated from the first semiconductor device, wherein the second semiconductor device is electrically coupled to the second RDL.

18. The method of claim 17, wherein no portion of the second semiconductor device is disposed over the third chip and no portion of the second semiconductor device is disposed over the second chip.

19. The method of claim 13, wherein the first molding compound extends along sidewalls of the second RDL.

* * * * *